(12) United States Patent
Wan

(10) Patent No.: US 10,263,032 B2
(45) Date of Patent: Apr. 16, 2019

(54) PHOTODIODE WITH DIFFERENT ELECTRIC POTENTIAL REGIONS FOR IMAGE SENSORS

(71) Applicant: Apple Inc., Cupertino, CA (US)

(72) Inventor: Chung Chun Wan, Fremont, CA (US)

(73) Assignee: Apple, Inc., Cupertino, CA (US)

(*) Notice: Subject to any disclaimer, the term of this patent is extended or adjusted under 35 U.S.C. 154(b) by 319 days.

(21) Appl. No.: 15/056,752

(22) Filed: Feb. 29, 2016

(65) Prior Publication Data

US 2016/0365380 A1    Dec. 15, 2016

Related U.S. Application Data

(63) Continuation of application No. 13/783,536, filed on Mar. 4, 2013, now Pat. No. 9,276,031.

(51) Int. Cl.
| | |
|---|---|
| *H01L 27/00* | (2006.01) |
| *H01L 27/146* | (2006.01) |
| *H04N 5/225* | (2006.01) |
| *G06F 3/044* | (2006.01) |

(52) U.S. Cl.
CPC .... *H01L 27/14643* (2013.01); *H01L 27/1461* (2013.01); *H01L 27/1464* (2013.01); *H01L 27/14603* (2013.01); *H01L 27/14609* (2013.01); *H01L 27/14612* (2013.01); *H01L 27/14623* (2013.01); *H04N 5/2253* (2013.01); *G06F 3/044* (2013.01)

(58) Field of Classification Search
CPC ............. H01L 27/146; H01L 27/14609; H01L 27/14612; H01L 27/14638; H04J 1/02

USPC .......... 250/214.1, 208.1; 257/292, 294, 463, 257/464; 348/294, 296, 308
See application file for complete search history.

(56) References Cited

U.S. PATENT DOCUMENTS

| | | |
|---|---|---|
| 4,686,572 A | 8/1987 | Takatsu |
| 4,686,648 A | 8/1987 | Fossum |
| 5,105,264 A | 4/1992 | Erhardt et al. |
| 5,329,313 A | 7/1994 | Keith |
| 5,396,893 A | 3/1995 | Oberg et al. |
| 5,471,515 A | 11/1995 | Fossum et al. |
| 5,541,402 A | 7/1996 | Ackland |

(Continued)

FOREIGN PATENT DOCUMENTS

| | | |
|---|---|---|
| CN | 1630350 | 6/2005 |
| CN | 1774032 | 5/2006 |

(Continued)

OTHER PUBLICATIONS

U.S. Appl. No. 15/590,775, filed May 9, 2017, Lee.

(Continued)

*Primary Examiner* — Kevin K Pyo
(74) *Attorney, Agent, or Firm* — Brownstein Hyatt Farber Schreck, LLC

(57) ABSTRACT

An image sensor pixel is disclosed. The pixel may include a photodiode having a first region with a first potential and a second region with a second, higher potential, with the second region being offset in depth from the first region in a semiconductor chip. A storage node may be positioned at substantially the same depth as the second region of the photodiode. A storage gate may be operable to transfer charge between the photodiode and the storage node.

20 Claims, 14 Drawing Sheets

(56) References Cited

U.S. PATENT DOCUMENTS

| | | |
|---|---|---|
| 5,550,677 A | 8/1996 | Schofield et al. |
| 5,781,312 A | 7/1998 | Noda |
| 5,841,126 A | 11/1998 | Fossum et al. |
| 5,880,459 A | 3/1999 | Pryor et al. |
| 5,949,483 A | 9/1999 | Fossum et al. |
| 6,008,486 A | 12/1999 | Stam et al. |
| 6,040,568 A | 3/2000 | Caulfield et al. |
| 6,233,013 B1 | 5/2001 | Hosier et al. |
| 6,348,929 B1 | 2/2002 | Acharya et al. |
| 6,448,550 B1 | 9/2002 | Nishimura |
| 6,528,833 B2 | 3/2003 | Lee et al. |
| 6,541,751 B1 | 4/2003 | Bidermann |
| 6,670,904 B1 | 12/2003 | Yakovlev |
| 6,713,796 B1 | 3/2004 | Fox |
| 6,714,239 B2 | 3/2004 | Guidash |
| 6,798,453 B1 | 9/2004 | Kaifu |
| 6,816,676 B2 | 11/2004 | Bianchi et al. |
| 6,905,470 B2 | 6/2005 | Lee et al. |
| 6,931,269 B2 | 8/2005 | Terry |
| 6,956,605 B1 | 10/2005 | Hashimoto |
| 6,982,759 B2 | 1/2006 | Goto |
| 7,075,049 B2 | 7/2006 | Rhodes et al. |
| 7,091,466 B2 | 8/2006 | Bock |
| 7,119,322 B2 | 10/2006 | Hong |
| 7,133,073 B1 | 11/2006 | Neter |
| 7,259,413 B2 | 8/2007 | Rhodes |
| 7,262,401 B2 | 8/2007 | Hopper et al. |
| 7,271,835 B2 | 9/2007 | Iizuka et al. |
| 7,282,028 B2 | 10/2007 | Kim et al. |
| 7,319,218 B2 | 1/2008 | Krymski |
| 7,332,786 B2 | 2/2008 | Altice |
| 7,390,687 B2 | 6/2008 | Boettiger |
| 7,415,096 B2 | 8/2008 | Sherman |
| 7,437,013 B2 | 10/2008 | Anderson |
| 7,443,421 B2 | 10/2008 | Stavely et al. |
| 7,446,812 B2 | 11/2008 | Ando et al. |
| 7,471,315 B2 | 12/2008 | Silsby et al. |
| 7,502,054 B2 | 3/2009 | Kalapathy |
| 7,525,168 B2 | 4/2009 | Hsieh |
| 7,554,067 B2 | 6/2009 | Zarnoski et al. |
| 7,555,158 B2 | 6/2009 | Park et al. |
| 7,589,316 B2 | 9/2009 | Dunki-Jacobs |
| 7,622,699 B2 | 11/2009 | Sakakibara et al. |
| 7,626,626 B2 | 12/2009 | Panicacci |
| 7,636,109 B2 | 12/2009 | Nakajima et al. |
| 7,667,400 B1 | 2/2010 | Goushcha |
| 7,671,435 B2 | 3/2010 | Ahn |
| 7,714,292 B2 | 5/2010 | Agarwal et al. |
| 7,728,351 B2 | 6/2010 | Shim |
| 7,733,402 B2 | 6/2010 | Egawa et al. |
| 7,742,090 B2 | 6/2010 | Street |
| 7,764,312 B2 | 7/2010 | Ono et al. |
| 7,773,138 B2 | 8/2010 | Lahav et al. |
| 7,786,543 B2 | 8/2010 | Hsieh |
| 7,796,171 B2 | 9/2010 | Gardner |
| 7,817,198 B2 | 10/2010 | Kang et al. |
| 7,838,956 B2 | 11/2010 | McCarten et al. |
| 7,873,236 B2 | 1/2011 | Li et al. |
| 7,880,785 B2 | 2/2011 | Gallagher |
| 7,884,402 B2 | 2/2011 | Ki |
| 7,906,826 B2 | 3/2011 | Martin et al. |
| 7,952,121 B2 | 5/2011 | Arimoto |
| 7,952,635 B2 | 5/2011 | Lauxtermann |
| 7,982,789 B2 | 7/2011 | Watanabe et al. |
| 8,026,966 B2 | 9/2011 | Altice |
| 8,032,206 B1 | 10/2011 | Farazi et al. |
| 8,089,036 B2 | 1/2012 | Manabe et al. |
| 8,089,524 B2 | 1/2012 | Urisaka |
| 8,094,232 B2 | 1/2012 | Kusaka |
| 8,116,540 B2 | 2/2012 | Dean |
| 8,140,143 B2 | 3/2012 | Picard et al. |
| 8,153,947 B2 | 4/2012 | Barbier et al. |
| 8,159,570 B2 | 4/2012 | Negishi |
| 8,159,588 B2 | 4/2012 | Boemler |
| 8,164,669 B2 | 4/2012 | Compton et al. |
| 8,174,595 B2 | 5/2012 | Honda et al. |
| 8,184,188 B2 | 5/2012 | Yaghmai |
| 8,194,148 B2 | 6/2012 | Doida |
| 8,194,165 B2 | 6/2012 | Border et al. |
| 8,222,586 B2 | 7/2012 | Lee |
| 8,227,844 B2 | 7/2012 | Adkisson et al. |
| 8,233,071 B2 | 7/2012 | Takeda |
| 8,259,228 B2 | 9/2012 | Wei et al. |
| 8,310,577 B1 | 11/2012 | Neter |
| 8,324,553 B2 | 12/2012 | Lee |
| 8,338,856 B2 | 12/2012 | Tai et al. |
| 8,340,407 B2 | 12/2012 | Kalman |
| 8,350,940 B2 | 1/2013 | Smith et al. |
| 8,355,117 B2 | 1/2013 | Niclass |
| 8,388,346 B2 | 3/2013 | Rantala et al. |
| 8,400,546 B2 | 3/2013 | Itano et al. |
| 8,456,540 B2 | 6/2013 | Egawa |
| 8,456,559 B2 | 6/2013 | Yamashita |
| 8,508,637 B2 | 8/2013 | Han et al. |
| 8,514,308 B2 | 8/2013 | Itonaga et al. |
| 8,520,913 B2 | 8/2013 | Dean |
| 8,546,737 B2 | 10/2013 | Tian et al. |
| 8,547,388 B2 | 10/2013 | Cheng |
| 8,575,531 B2 | 11/2013 | Hynecek et al. |
| 8,581,992 B2 | 11/2013 | Hamada |
| 8,594,170 B2 | 11/2013 | Mombers et al. |
| 8,619,163 B2 | 12/2013 | Ogua |
| 8,619,170 B2 | 12/2013 | Mabuchi |
| 8,629,484 B2 | 1/2014 | Ohri et al. |
| 8,634,002 B2 | 1/2014 | Kita |
| 8,637,875 B2 | 1/2014 | Finkelstein et al. |
| 8,648,947 B2 | 2/2014 | Sato et al. |
| 8,653,434 B2 | 2/2014 | Johnson et al. |
| 8,723,975 B2 | 5/2014 | Solhusvik |
| 8,724,096 B2 | 5/2014 | Gosch et al. |
| 8,730,345 B2 | 5/2014 | Watanabe |
| 8,754,983 B2 | 6/2014 | Sutton |
| 8,755,854 B2 | 6/2014 | Addison et al. |
| 8,759,736 B2 | 6/2014 | Yoo |
| 8,760,413 B2 | 6/2014 | Peterson et al. |
| 8,767,104 B2 | 7/2014 | Makino et al. |
| 8,803,990 B2 | 8/2014 | Smith |
| 8,817,154 B2 | 8/2014 | Manabe et al. |
| 8,879,686 B2 | 11/2014 | Okada et al. |
| 8,902,330 B2 | 12/2014 | Theuwissen |
| 8,908,073 B2 | 12/2014 | Minagawa |
| 8,934,030 B2 | 1/2015 | Kim et al. |
| 8,936,552 B2 | 1/2015 | Kateraas et al. |
| 8,946,610 B2 | 2/2015 | Iwabuchi et al. |
| 8,982,237 B2 | 3/2015 | Chen |
| 9,041,837 B2 | 5/2015 | Li |
| 9,017,748 B2 | 6/2015 | Theuwissen |
| 9,054,009 B2 | 6/2015 | Oike et al. |
| 9,058,081 B2 | 6/2015 | Baxter |
| 9,066,017 B2 | 6/2015 | Geiss |
| 9,066,660 B2 | 6/2015 | Watson et al. |
| 9,088,727 B2 | 7/2015 | Trumbo |
| 9,094,623 B2 | 7/2015 | Kawaguchi |
| 9,099,604 B2 | 8/2015 | Roy |
| 9,100,597 B2 | 8/2015 | Hu |
| 9,106,859 B2 | 8/2015 | Kizuna et al. |
| 9,131,171 B2 | 9/2015 | Aoki et al. |
| 9,154,750 B2 | 10/2015 | Pang |
| 9,160,949 B2 | 10/2015 | Zhang et al. |
| 9,164,144 B2 | 10/2015 | Dolinsky |
| 9,178,100 B2 | 11/2015 | Webster et al. |
| 9,209,320 B1 | 12/2015 | Webster |
| 9,225,948 B2 | 12/2015 | Hasegawa |
| 9,232,150 B2 | 1/2016 | Kleekajai et al. |
| 9,232,161 B2 | 1/2016 | Suh |
| 9,235,267 B2 | 1/2016 | Burrough et al. |
| 9,270,906 B2 | 2/2016 | Peng et al. |
| 9,276,031 B2 | 3/2016 | Wan |
| 9,277,144 B2 | 3/2016 | Kleekajai et al. |
| 9,287,304 B2 | 3/2016 | Park et al. |
| 9,288,380 B2 | 3/2016 | Nomura |
| 9,288,404 B2 | 3/2016 | Papiashvili |
| 9,293,500 B2 | 3/2016 | Sharma et al. |
| 9,319,611 B2 | 4/2016 | Fan |

(56) References Cited

U.S. PATENT DOCUMENTS

| | | |
|---|---|---|
| 9,331,116 B2 | 5/2016 | Webster |
| 9,344,649 B2 | 5/2016 | Bock |
| 9,417,326 B2 | 8/2016 | Niclass et al. |
| 9,438,258 B1 | 9/2016 | Yoo |
| 9,445,018 B2 | 9/2016 | Fettig et al. |
| 9,448,110 B2 | 9/2016 | Wong |
| 9,467,553 B2 | 10/2016 | Heo et al. |
| 9,478,030 B1 | 10/2016 | Lecky |
| 9,497,397 B1 | 11/2016 | Kleekajai et al. |
| 9,516,244 B2 | 12/2016 | Borowski |
| 9,549,099 B2 | 1/2017 | Fan |
| 9,560,339 B2 | 1/2017 | Borowski |
| 9,584,743 B1 | 2/2017 | Lin et al. |
| 9,596,423 B1 | 3/2017 | Molgaard |
| 9,749,556 B2 | 8/2017 | Fettig et al. |
| 9,774,318 B2 | 9/2017 | Song |
| 9,781,368 B2 | 10/2017 | Song |
| 9,831,283 B2 | 11/2017 | Shepard et al. |
| 9,888,198 B2 | 2/2018 | Mauritzson et al. |
| 9,894,304 B1 | 2/2018 | Smith |
| 9,912,883 B1 | 3/2018 | Agranov et al. |
| 10,136,090 B2 | 11/2018 | Vogelsang et al. |
| 10,153,310 B2 | 12/2018 | Zhang et al. |
| 2003/0036685 A1 | 2/2003 | Goodman et al. |
| 2004/0207836 A1 | 10/2004 | Chhibber et al. |
| 2005/0026332 A1 | 2/2005 | Fratti et al. |
| 2006/0274161 A1 | 12/2006 | Ing et al. |
| 2007/0263099 A1 | 11/2007 | Motta et al. |
| 2008/0177162 A1 | 7/2008 | Bae et al. |
| 2008/0315198 A1 | 12/2008 | Jung |
| 2009/0096901 A1 | 4/2009 | Bae et al. |
| 2009/0101914 A1 | 4/2009 | Hirotsu et al. |
| 2009/0146234 A1 | 6/2009 | Luo et al. |
| 2009/0201400 A1 | 8/2009 | Zhang et al. |
| 2009/0219266 A1 | 9/2009 | Lim et al. |
| 2010/0134631 A1 | 6/2010 | Voth |
| 2011/0080500 A1 | 4/2011 | Wang et al. |
| 2011/0156197 A1 | 6/2011 | Tivarus et al. |
| 2011/0164162 A1 | 7/2011 | Kato |
| 2011/0193824 A1 | 8/2011 | Modarres et al. |
| 2011/0245690 A1 | 10/2011 | Watson et al. |
| 2012/0092541 A1 | 4/2012 | Tuulos et al. |
| 2012/0098964 A1 | 4/2012 | Oggier et al. |
| 2012/0127088 A1 | 5/2012 | Pance et al. |
| 2012/0147207 A1 | 6/2012 | Itonaga |
| 2013/0147981 A1 | 6/2013 | Wu |
| 2013/0155271 A1 | 6/2013 | Ishii |
| 2013/0222584 A1 | 8/2013 | Aoki et al. |
| 2014/0049683 A1 | 2/2014 | Guenter |
| 2014/0071321 A1 | 3/2014 | Seyama |
| 2014/0132528 A1 | 5/2014 | Catton |
| 2014/0231630 A1 | 8/2014 | Rae et al. |
| 2014/0240550 A1 | 8/2014 | Taniguchi |
| 2014/0247378 A1* | 9/2014 | Sharma ............... H04N 5/35536 348/280 |
| 2014/0252201 A1 | 9/2014 | Li et al. |
| 2014/0267855 A1 | 9/2014 | Fan |
| 2014/0347533 A1 | 11/2014 | Toyoda |
| 2015/0062391 A1 | 3/2015 | Murata |
| 2015/0163392 A1 | 6/2015 | Malone et al. |
| 2015/0163422 A1 | 6/2015 | Fan et al. |
| 2015/0277559 A1 | 10/2015 | Vescovi et al. |
| 2015/0312479 A1 | 10/2015 | McMahon et al. |
| 2015/0350575 A1 | 12/2015 | Agranov et al. |
| 2016/0050379 A1 | 2/2016 | Jiang et al. |
| 2016/0099371 A1 | 4/2016 | Webster |
| 2016/0205311 A1 | 7/2016 | Mandelli et al. |
| 2016/0218236 A1 | 7/2016 | Dhulla et al. |
| 2016/0219232 A1 | 7/2016 | Murata |
| 2016/0274237 A1 | 9/2016 | Stutz |
| 2016/0307325 A1 | 10/2016 | Wang et al. |
| 2016/0356890 A1 | 12/2016 | Fried et al. |
| 2017/0047363 A1 | 2/2017 | Choi et al. |
| 2017/0082746 A1 | 3/2017 | Kubota et al. |
| 2017/0084133 A1 | 3/2017 | Cardinali et al. |
| 2017/0142325 A1 | 5/2017 | Shimokawa et al. |
| 2017/0223292 A1 | 8/2017 | Ikeda |
| 2017/0272675 A1 | 9/2017 | Kobayashi |
| 2017/0373106 A1 | 12/2017 | Li et al. |
| 2018/0213205 A1 | 7/2018 | Oh |

FOREIGN PATENT DOCUMENTS

| | | |
|---|---|---|
| CN | 1833429 | 9/2006 |
| CN | 1842138 | 10/2006 |
| CN | 1947414 | 4/2007 |
| CN | 101189885 | 5/2008 |
| CN | 101221965 | 7/2008 |
| CN | 101233763 | 7/2008 |
| CN | 101472059 | 7/2009 |
| CN | 101567977 | 10/2009 |
| CN | 101622859 | 1/2010 |
| CN | 101739955 | 6/2010 |
| CN | 101754029 | 6/2010 |
| CN | 101803925 | 8/2010 |
| CN | 102036020 | 4/2011 |
| CN | 102067584 | 5/2011 |
| CN | 102208423 | 10/2011 |
| CN | 102451160 | 5/2012 |
| CN | 102668542 | 9/2012 |
| CN | 102820309 | 12/2012 |
| CN | 102821255 | 12/2012 |
| CN | 103024297 | 4/2013 |
| CN | 103051843 | 4/2013 |
| CN | 103329513 | 9/2013 |
| CN | 103546702 | 1/2014 |
| CN | 204761615 | 11/2015 |
| EP | 1763228 | 3/2007 |
| EP | 2023611 | 2/2009 |
| EP | 2107610 | 10/2009 |
| EP | 2230690 | 9/2010 |
| EP | 2512126 | 10/2012 |
| EP | 2787531 | 10/2014 |
| JP | S61123287 | 6/1986 |
| JP | 2007504670 | 8/1987 |
| JP | 2000059697 | 2/2000 |
| JP | 2001211455 | 8/2001 |
| JP | 2001358994 | 12/2001 |
| JP | 2004111590 | 4/2004 |
| JP | 2005318504 | 11/2005 |
| JP | 2006287361 | 10/2006 |
| JP | 2007516654 | 6/2007 |
| JP | 2008507908 | 3/2008 |
| JP | 2008271280 | 11/2008 |
| JP | 2008543061 | 11/2008 |
| JP | 2009021809 | 1/2009 |
| JP | 2009159186 | 7/2009 |
| JP | 2009212909 | 9/2009 |
| JP | 2009296465 | 12/2009 |
| JP | 2010080604 | 4/2010 |
| JP | 2010114834 | 5/2010 |
| JP | 2011040926 | 2/2011 |
| JP | 201149697 | 3/2011 |
| JP | 2011091775 | 5/2011 |
| JP | 2011097646 | 12/2011 |
| JP | 2012010306 | 1/2012 |
| JP | 2012019516 | 1/2012 |
| JP | 2012513160 | 6/2012 |
| JP | 2013051523 | 3/2013 |
| JP | 2013070240 | 4/2013 |
| JP | 2013529035 | 7/2013 |
| KR | 20030034424 | 5/2003 |
| KR | 20030061157 | 7/2003 |
| KR | 20050103732 | 11/2005 |
| KR | 2008/0069851 | 7/2008 |
| KR | 20100008239 | 1/2010 |
| KR | 20100065084 | 6/2010 |
| KR | 20130074459 | 7/2013 |
| TW | 200520551 | 6/2005 |
| TW | 200803481 | 1/2008 |
| TW | 201110689 | 3/2011 |
| TW | 201301881 | 1/2013 |
| WO | WO 05/041304 | 5/2005 |
| WO | WO 06/014641 | 2/2006 |

(56) References Cited

FOREIGN PATENT DOCUMENTS

| WO | WO 06/130443 | 12/2006 |
|---|---|---|
| WO | WO 07/049900 | 5/2007 |
| WO | WO 10/120945 | 10/2010 |
| WO | WO 12/011095 | 1/2012 |
| WO | WO 12/032353 | 3/2012 |
| WO | WO 12/053363 | 4/2012 |
| WO | WO 12/088338 | 6/2012 |
| WO | WO 12/122572 | 9/2012 |
| WO | WO 12/138687 | 10/2012 |
| WO | WO 13/008425 | 1/2013 |
| WO | WO 13/179018 | 12/2013 |
| WO | WO 13/179020 | 12/2013 |

OTHER PUBLICATIONS

U.S. Appl. No. 15/627,409, filed Jun. 19, 2017, Agranov et al.
U.S. Appl. No. 15/653,468, filed Jul. 18, 2017, Zhang et al.
U.S. Appl. No. 15/682,255, filed Aug. 21, 2017, Li et al.
U.S. Appl. No. 15/699,806, filed Sep. 8, 2017, Li et al.
U.S. Appl. No. 15/713,477, filed Sep. 22, 2017, Mandai et al.
U.S. Appl. No. 15/713,520, filed Sep. 22, 2017, Mandai et al.
U.S. Appl. No. 15/879,365, filed Jan. 24, 2018, Mandai et al.
U.S. Appl. No. 15/879,350, filed Jan. 24, 2018, Mandai et al.
U.S. Appl. No. 15/880,285, filed Jan. 25, 2018, Laifenfeld et al.
U.S. Appl. No. 13/782,532, filed Mar. 1, 2013, Sharma et al.
U.S. Appl. No. 13/783,536, filed Mar. 4, 2013, Wan.
U.S. Appl. No. 13/785,070, filed Mar. 5, 2013, Li.
U.S. Appl. No. 13/787,094, filed Mar. 6, 2013, Li et al.
U.S. Appl. No. 13/797,851, filed Mar. 12, 2013, Li.
U.S. Appl. No. 13/830,748, filed Mar. 14, 2013, Fan.
U.S. Appl. No. 14/098,504, filed Dec. 5, 2013, Fan et al.
U.S. Appl. No. 14/207,150, filed Mar. 12, 2014, Kleekajai et al.
U.S. Appl. No. 14/207,176, filed Mar. 12, 2014, Kleekajai et al.
U.S. Appl. No. 14/276,728, filed May 13, 2014, McMahon et al.
U.S. Appl. No. 14/292,599, filed May 30, 2014, Agranov et al.
U.S. Appl. No. 14/462,032, filed Aug. 18, 2014, Jiang et al.
U.S. Appl. No. 14/481,806, filed Sep. 9, 2014, Kleekajai et al.
U.S. Appl. No. 14/481,820, filed Sep. 9, 2014, Lin et al.
U.S. Appl. No. 14/501,429, filed Sep. 30, 2014, Malone et al.
U.S. Appl. No. 14/503,322, filed Sep. 30, 2014, Molgaard.
U.S. Appl. No. 14/569,346, filed Dec. 12, 2014, Kestelli et al.
U.S. Appl. No. 14/611,917, filed Feb. 2, 2014, Lee et al.
U.S. Appl. No. 15/445,973, filed Feb. 28, 2017, Lin et al.
Shen et al., "Stresses, Curvatures, and Shape Changes Arising from Patterned Lines on Silicon Wafers," Journal of Applied Physics, vol. 80, No. 3, Aug. 1996, pp. 1388-1398.
Aoki, et al., "Rolling-Shutter Distortion-Free 3D Stacked Image Sensor with—160dB Parasitic Light Sensitivity In-Pixel Storage Node," ISSCC 2013, Session 27, Image Sensors, 27.3 27.3 A, Feb. 20, 2013, retrieved on Apr. 11, 2014 from URL:http://ieeexplore.ieee.org/stamp/stamp.jsp?tp=&arnumber=6487824.
Elgendi, "On the Analysis of Fingertip Photoplethysmogram Signals," *Current Cardiology Reviews*, 2012, vol. 8, pp. 14-25.
Feng, et al., "On the Stoney Formula for a Thin Film/Substrate System with Nonuniform Substrate Thickness," *Journal of Applied Mechanics*, Transactions of the ASME, vol. 74, Nov. 2007, pp. 1276-1281.

Fu, et al., "Heart Rate Extraction from Photoplethysmogram Waveform Using Wavelet Multui-resolution Analysis," *Journal of Medical and Biological Engineering*, 2008, vol. 28, No. 4, pp. 229-232.
Han, et al., "Artifacts in wearable photoplethysmographs during daily life motions and their reduction with least mean square based active noise cancellation method," *Computers in Biology and Medicine*, 2012, vol. 42, pp. 387-393.
Lopez-Silva, et al., "Heuristic Algorithm for Photoplethysmographic Heart Rate Tracking During Maximal Exercise Test," *Journal of Medical and Biological Engineering*, 2011, vol. 12, No. 3, pp. 181-188.
Santos, et al., "Accelerometer-assisted PPG Measurement During Physical Exercise Using the LAVIMO Sensor System," *Acta Polytechnica*, 2012, vol. 52, No. 5, pp. 80-85.
Sarkar, et al., "Fingertip Pulse Wave (PPG signal) Analysis and Heart Rate Detection," *International Journal of Emerging Technology and Advanced Engineering*, 2012, vol. 2, No. 9, pp. 404-407.
Schwarzer, et al., On the determination of film stress from substrate bending: STONEY'S formula and its limits, Jan. 2006, 19 pages.
Yan, et al., "Reduction of motion artifact in pulse oximetry by smoothed pseudo Wigner-Ville distribution," *Journal of NeuroEngineering and Rehabilitation*, 2005, vol. 2, No. 3, pp. 1-9.
Yousefi, et al., "Adaptive Cancellation of Motion Artifact in Wearable Biosensors," 34th Annual International Conference of the IEEE EMBS, San Diego, California, Aug./Sep. 2012, pp. 2004-2008.
Charbon, et al., SPAD-Based Sensors, *TOF Range-Imaging Cameras*, F. Remondino and D. Stoppa (eds.), 2013, Springer-Verlag Berlin Heidelberg, pp. 11-38.
Cox, "Getting histograms with varying bin widths," http://www.stata.com/support/faqs/graphics/histograms-with-varying-bin-widths/, Nov. 13, 2017, 5 pages.
Gallivanoni, et al., "Progress n Quenching Circuits for Single Photon Avalanche Diodes," IEEE Transactions on Nuclear Science, vol. 57, No. 6, Dec. 2010, pp. 3815-3826.
Leslar, et al., "Comprehensive Utilization of Temporal and Spatial Domain Outlier Detection Methods for Mobile Terrestrial LiDAR Data," Remote Sensing, 2011, vol. 3, pp. 1724-1742.
Mota, et al., "A flexible multi-channel high-resolution Time-to-Digital Converter ASIC," *Nuclear Science Symposium Conference Record IEEE*, 2000, Engineering School of Geneva, Microelectronics Lab, Geneva, Switzerland, 8 pages.
Niclass, et al., "Design and Characterization of a CMOS 3-D Image Sensor Based on Single Photon Avalanche Diodes," *IEEE Journal of Solid-State Circuits*, vol. 40, No. 9, Sep. 2005, pp. 1847-1854.
Shin, et al., "Photon-Efficient Computational 3D and Reflectivity Imaging with Single-Photon Detectors," IEEE International Conference on Image Processing, Paris, France, Oct. 2014, 11 pages.
Tisa, et al., "Variable-Load Quenching Circuit for single-photon avalanche diodes," Optics Express, vol. 16, No. 3, Feb. 4, 2008, pp. 2232-2244.
Ullrich, et al., "Linear LIDAR versus Geiger-mode LIDAR: Impact on data properties and data quality," *Laser Radar Technology and Applications XXI*, edited by Monte D. Turner, Gary W. Kamerman, Proc. of SPIE, vol. 9832, 983204, 2016, 17 pages.
Jahromi et al., "A Single Chip Laser Radar Receiver with a 9×9 SPAD Detector Array and a 10-channel TDC," 2013 Proceedings of the ESSCIRC, IEEE, Sep. 14, 2015, pp. 364-367.

\* cited by examiner

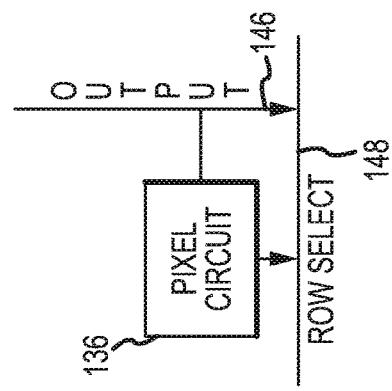
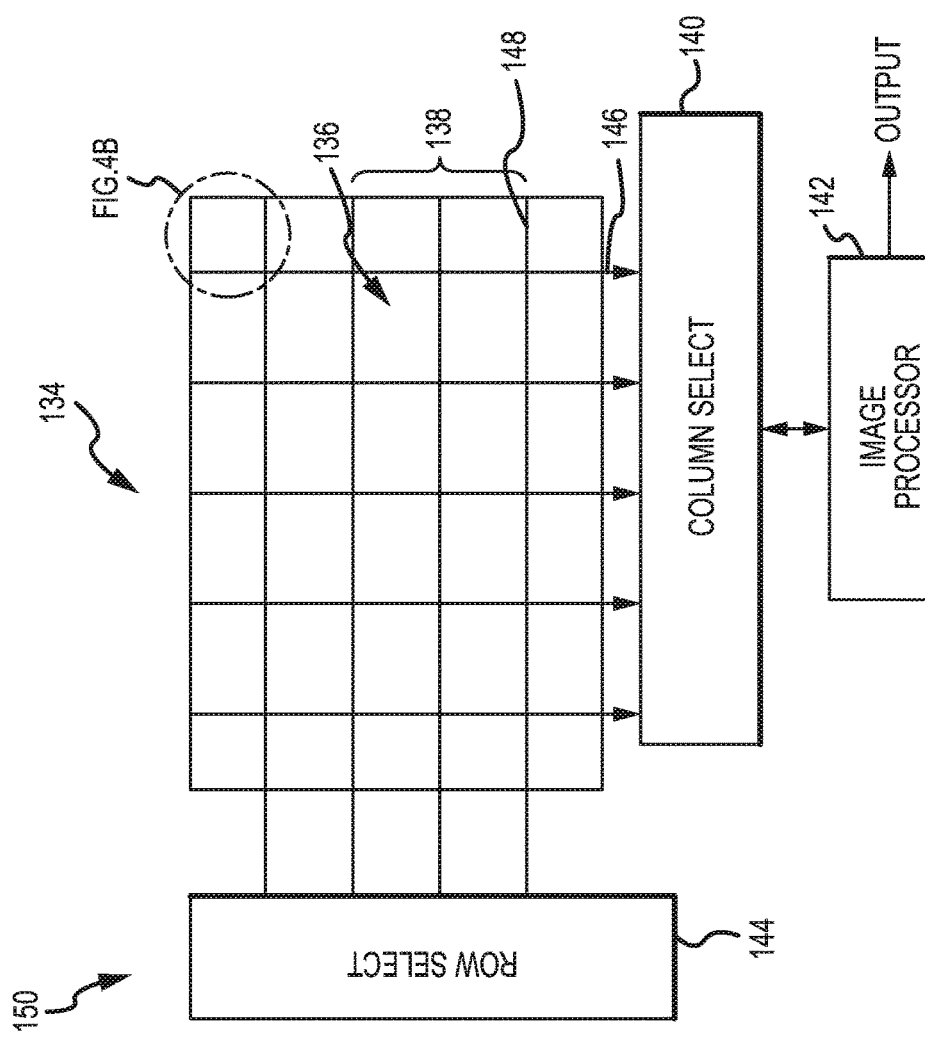

PHOTODIODE WITH DIFFERENT ELECTRIC POTENTIAL REGIONS FOR IMAGE SENSORS

CROSS-REFERENCE TO RELATED APPLICATION

This application is a continuation of U.S. patent application Ser. No. 13/783,536, filed Mar. 4, 2013, entitled "Photodiode with Different Electric Potential Regions for Image Sensors", which is incorporated by reference in its entirety as if fully disclosed herein.

TECHNICAL FIELD

The present invention relates generally to image sensors, and, more specifically, to a photodiode with different electric potential regions for use in an image sensor

BACKGROUND

Many widely-used image sensors include global-shutter pixels because of their high efficiency and lack of a blur as compared to rolling-shutter pixels. Global shutter pixels typically include a storage node, separate from the photodiode region, where charge generated during a previous integration frame can be stored and subsequently read out. All of the pixels in a global shutter image sensor typically transfer charge generated in their respective photodiodes to their respective storage nodes 'globally,' which eliminates the blur caused by the row-by-row exposure and readout in rolling shutter pixels. The global shutter storage nodes can be read out when convenient, such as while the photodiode is integrating charge for a subsequent frame.

The storage node in global shutter pixels is usually located on the same surface of a semiconductor wafer as the photodiode region, and thus typically needs to be shielded in order to maintain the integrity of the charge stored in the storage node. Also, positioning the storage node on the same surface of a semiconductor wafer as the photodiode reduces the amount of surface area of the photodiode that can be exposed to light, and hence reduces the sensitivity of the pixel.

SUMMARY

One example of the present disclosure may take the form of an image sensor pixel. The image sensor pixel may include a photodiode having a first region with a first potential and a second region with a second, higher potential. The second region may be offset in depth from the first region in a semiconductor chip. A storage node may be positioned at substantially the same depth as the second region of the photodiode, and a storage gate may be operable to selectively transfer charge from the photodiode to the storage node.

Another example of the disclosure may take the form of a method of operating an image sensor pixel. The method may include integrating charge in a first region of a photodiode, and funneling charge from the first region of the photodiode to a second region of the photodiode responsive to a potential difference between the first and second regions. The method may also include transferring charge from the second region of the photodiode to a storage node positioned at least partially beneath the first region of the photodiode.

Another example of the disclosure may take the form of a method of manufacturing an image sensor pixel. The method may include forming a storage node and a first region of a photodiode on a first surface of a silicon wafer. The method may also include forming a second region of the photodiode on a second surface of the silicon wafer, the second region of the photodiode having a lower concentration of doping than the first region, and the second region of the photodiode at least partially covering the storage node formed on the first surface of the silicon wafer.

BRIEF DESCRIPTION OF THE DRAWINGS

FIG. 4A is a simplified diagram of an image sensor architecture for a camera of the electronic device.

FIG. 4B is an enlarged view of a pixel architecture of FIG. 4A illustrating a single pixel.

SPECIFICATION

Overview

In some embodiments disclosed herein, apparatuses and methods for transferring charge from one region of a photodiode to another region of the photodiode in an image sensor are disclosed. The charge may be funneled from a first region to a second region due to different electric potentials in the respective first and second regions, with charge generally flowing to the region with the higher potential. Having two or more regions of a photodiode on a single semiconductor chip may allow for an image pixel to be formed on two sides of the semiconductor chip, with the charge funneling phenomenon being used to transfer charge from one side of the chip (e.g., a backside illuminated photodiode) to another side of the chip (e.g., with transfer transistors and circuitry), thus taking advantage of both sides of the semiconductor chip and increasing the efficiency and size of the pixels without increasing the absolute size of the overall image sensor.

Figure 1A:
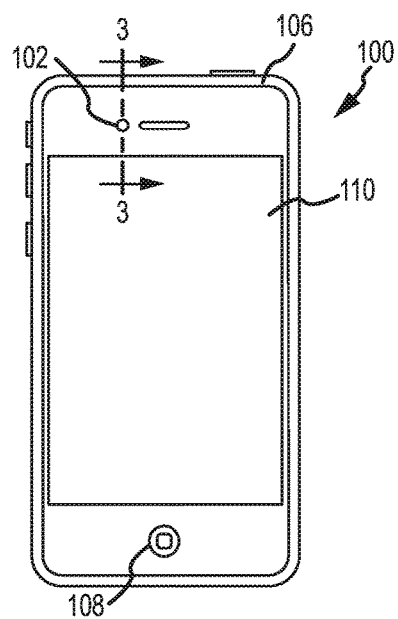
FIG. 1A is a front perspective view of an electronic device including one or more cameras.
Figure 1B:
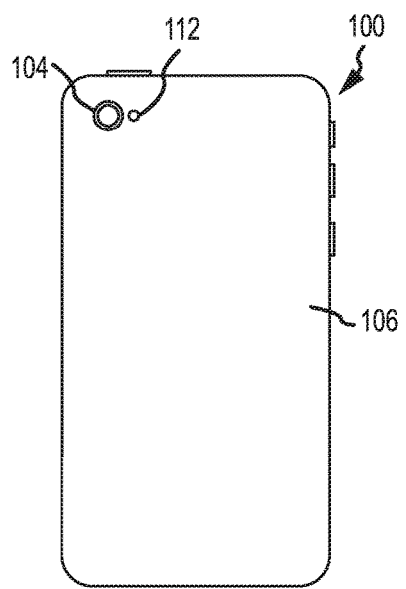
FIG. 1B is a rear perspective view of the electronic device of FIG. 1A.

Turning now to the figures, an image sensor and an illustrative electronic device for incorporating the image sensor will be discussed in more detail. FIG. 1A is a front elevation view of an electronic device 100 including one or more image sensors. FIG. 1B is a rear elevation view of the electronic device 100. The electronic device 100 may include any or all of a first camera 102, a second camera 104, an enclosure 106, a display 110, and an input/output button 108. The electronic device 100 may be substantially any type of electronic or computing device, such as, but not limited to, a computer, a laptop, a tablet, a smart phone, a digital camera, a printer, a scanner, a copier, or the like. The electronic device 100 may also include one or more internal components (not shown) typical of a computing or electronic device, such as, but not limited to, one or more processors, memory components, network interfaces, and so on. Examples of such internal components will be discussed with respect to FIG. 2.

As shown in FIG. 1, the enclosure 106 may form an outer surface and protective case for the internal components of the electronic device 100 and may at least partially surround the display 110. The enclosure 106 may be formed of one or more components operably connected together, such as a front piece and a back piece, or may be formed of a single piece operably connected to the display 110.

The input member 108 (which may be a switch, button, capacitive sensor, or other input mechanism) allows a user to interact with the electronic device 100. For example, the input member 108 may be a button or switch to alter the volume, return to a home screen, and the like. The electronic device 100 may include one or more input members 108 and/or output members, and each member may have a single input or output function or multiple input/output functions.

The display 110 may be operably connected to the electronic device 100 or may be communicatively coupled thereto. The display 110 may provide a visual output for the electronic device 100 and/or may function to receive user inputs to the electronic device 100. For example, the display 110 may be a multi-touch capacitive sensing screen that may detect one or more user inputs.

Figure 2:
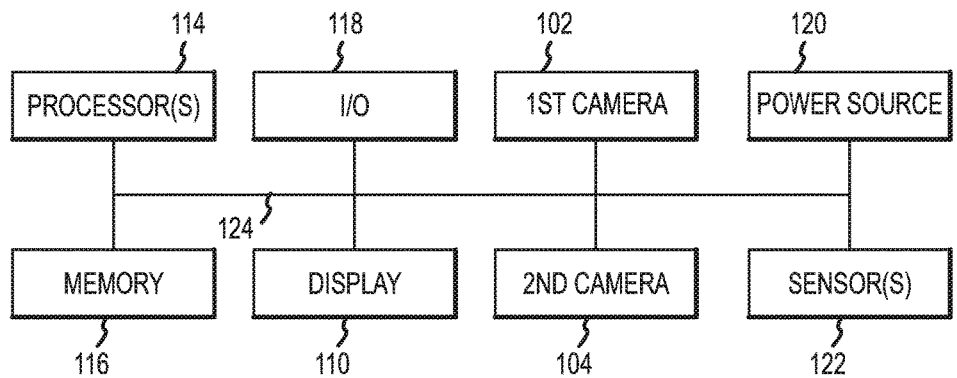
FIG. 2 is a simplified block diagram of the electronic device of FIG. 1A.

The electronic device 100 may also include a number of internal components. FIG. 2 is a simplified block diagram of the electronic device 100. The electronic device 100 may also include one or more processors 114, a storage or memory component 116, an input/output interface 118, a power source 120, and one or more sensors 122, each will be discussed in turn below.

The processor 114 may control operation of the electronic device 100. The processor 114 may be in communication, either directly or indirectly, with substantially all of the components of the electronic device 100. For example, one or more system buses 124 or other communication mechanisms may provide communication between the processor 114, the cameras 102, 104, the display 110, the input member 108, the sensors 122, and so on. The processor 114 may be any electronic device cable of processing, receiving, and/or transmitting instructions. For example, the processor 114 may be a microprocessor or a microcomputer. As described herein, the term "processor" is meant to encompass a single processor or processing unit, multiple processors, or multiple processing units, or other suitably configured computing element(s).

The memory 116 may store electronic data that may be utilized by the electronic device 100. For example, the memory 116 may store electrical data or content e.g., audio files, video files, document files, and so on, corresponding to various applications. The memory 116 may be, for example, non-volatile storage, a magnetic storage medium, optical storage medium, magneto-optical storage medium, read only memory, random access memory, erasable programmable memory, or flash memory.

The input/output interface 118 may receive data from a user or one or more other electronic devices. Additionally, the input/output interface 118 may facilitate transmission of data to a user or to other electronic devices. For example, in embodiments where the electronic device 100 is a phone, the input/output interface 118 may be used to receive data from a network, or may be used to send and transmit electronic signals via a wireless or wired connection (Internet, WiFi, Bluetooth, and Ethernet being a few examples). In some embodiments, the input/output interface 118 may support multiple network or communication mechanisms. For example, the network/communication interface 118 may pair with another device over a Bluetooth network to transfer signals to the other device, while simultaneously receiving data from a WiFi or other network.

The power source 120 may be substantially any device capable of providing energy to the electronic device 100. For example, the power source 120 may be a battery, a connection cable that may be configured to connect the electronic device 100 to another power source such as a wall outlet, or the like.

The sensors 122 may include substantially any type of sensor. For example, the electronic device 100 may include one or more audio sensors (e.g., microphones), light sensors (e.g., ambient light sensors), gyroscopes, accelerometers, or the like. The sensors 122 may be used to provide data to the processor 114, which may be used to enhance or vary functions of the electronic device 100.

Figure 3:
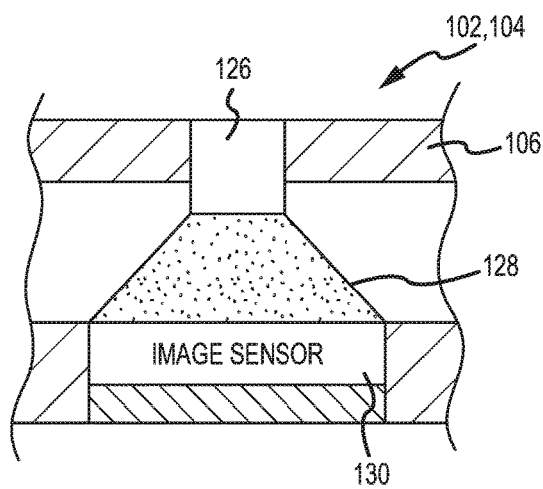
FIG. 3 is a simplified schematic cross-section view of the electronic device of FIG. 1A taken along line 3-3 in FIG. 1A.

With reference again to FIGS. 1A and 1B, the electronic device 100 may also include one or more cameras 102, 104 and optionally a flash 112 or light source for the cameras 102, 104. FIG. 3 is a simplified cross-section view of the first camera 102, taken along line 3-3 in FIG. 1A. Although FIG. 3 illustrates the first camera 102, it should be noted that the second camera 104 may be substantially similar to the first camera 102. In some embodiments, one camera may include a global shutter configured image sensor and one camera may include a rolling shutter configured image sensor. In other examples, one camera may have an image sensor with a higher resolution than the other. Likewise, it should be appreciated that the structure shown in FIG. 3 is but one possible structure for either of the first and second cameras.

With reference to FIG. 3, the cameras 102, 104 may include a lens 126 in optical communication with an image sensor 130. The lens 126 may be operably connected to the enclosure 106 and positioned above the image sensor 130. The lens 126 may direct or transmit light 128 within its field of view onto a photodiode (discussed in more detail below) of the image sensor 130. The image sensor 130 may convert light 128 into electrical signals that may represent the light from the captured scene. In other words, the image sensor 130 captures the light 128 optically transmitted via the lens 126 into electrical signals.

Image Sensor Architecture

Figure 5:
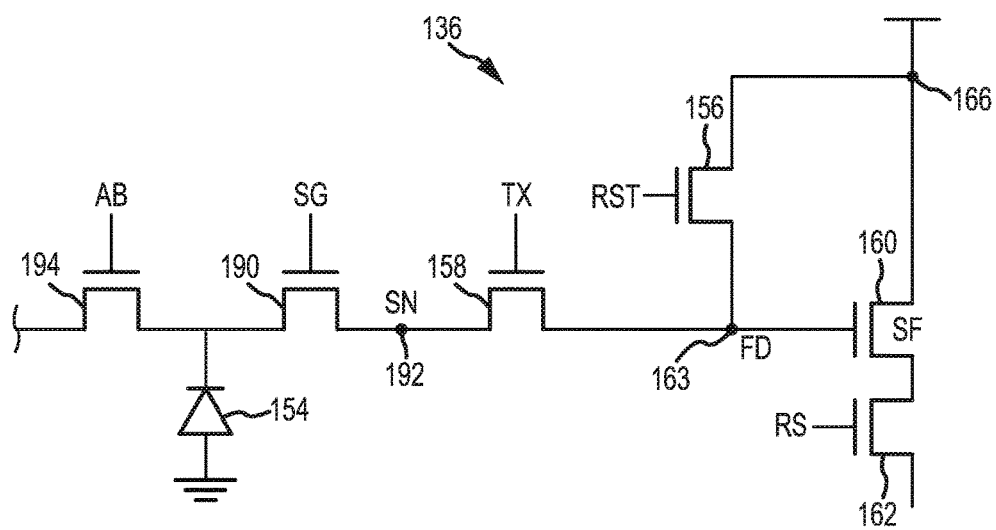
FIG. 5 is a simplified schematic view of a pixel cell having a global shutter configuration.

An illustrative architecture for the image sensor 130 will now be discussed in more detail. FIG. 4A is a simplified schematic of one possible architecture for the image sensor 130. FIG. 4B is an enlarged view of a pixel of the pixel architecture of FIG. 4A. FIG. 5 is a simplified schematic view of the pixel of FIG. 4A. With reference to FIGS. 4A-5, the electronic device 100 may include an image processing component having a pixel architecture defining one or more pixels 136 and/or groups of pixel cells 138 (e.g., groups of pixels 136 grouped together to form a Bayer pixel or other set of pixels). The pixel architecture 134 may be in communication with a column select 140 through one or more column output lines 146 and a row select 144 through one or more row select lines 148.

The row select 144 and/or the column select 140 may be in communication with an image processor 142. The image processor 142 may process data from the pixels 136 and provide that data to the processor 114 and/or other components of the electronic device 100. It should be noted that in some embodiments, the image processor 142 may be incorporated into the processor 114 or separate therefrom. The row select 144 may selectively activate a particular pixel 136 or group of pixels, such as all of the pixels 136 on a certain row. The column select 140 may selectively receive the data output from select pixels 136 or groups of pixels 136 (e.g., all of the pixels with a particular column).

With reference to the simplified schematic of one embodiment of a pixel 136 illustrated in FIG. 5, each pixel 136 may include a photodiode 154. The photodiode 154 may be in optical communication with the lens 126 to receive light transmitted therethrough. The photodiode 154 may absorb light and convert the absorbed light into an electrical signal. The photodiode 154 may be an electron-based photodiode or a hole-based photodiode. Additionally, it should be noted that the term "photodiode," as used herein, is meant to encompass substantially any type of photon or light detecting component, such as a photogate or other photo-sensitive region.

The photodiode 154 may be coupled to a storage node SN 192 through a storage gate SG 190. The storage node 192 may store charge from the photodiode 154 to allow a global shutter operation, and may in some examples be electrically and/or optically shielded so as to prevent stray charge and/or light from corrupting the contents of the storage node 192. The storage node 192 may be coupled to a floating diffusion node FD 163 through a transfer gate TX 158. The floating diffusion node 163 is provided as the gate input to a source follower gate SF 160. A row select gate 162 and the source follower gate 160 may be coupled to a reference voltage source (Vdd) node 166. The row select gate 162 may further be coupled to a row select line (e.g., 148 in FIG. 4B) for the pixel 136. The control circuitry for the pixel 136 may additionally or alternatively include one or more other gates. For example, an anti-blooming gate 194 may be in communication with the photodiode 154 to drain excess charge from the photodiode 154—such as when the photodiode 154 is not integrating charge.

In some embodiments, the photodiode 154 and the gates 194, 190, 158, 156, 160, 162 of the pixel 136 may all be positioned on a single semiconductor chip or wafer, whereas in other embodiments, some components of the pixel 136 may be on one semiconductor chip with other components on a second chip. For example, the photodiode 154, the storage gate 190, the storage node 192 may be positioned on one chip, while the floating diffusion node 163, reset gate 156, and so forth positioned on another chip, with the transfer transistor 158 vertically extending between the two chips. As another example, the photodiode 154, along with the storage gate 190, the transfer gate 158, the source follower gate 160, the reset gate 156, and the row select gate 162 may be positioned on one chip, with further readout circuitry positioned on another chip. In general, the components of the pixel 136 may be spread across one or a plurality of chips.

In operation, when one of the cameras 102, 104 is actuated to capture an image, the reference voltage 166 is applied to the reset gate 156, the transfer gate 158, and the storage gate 190 in order to deplete charge from the photodiode 154. In some embodiments, the cameras 102, 104 may not include a shutter over the lens 126, and so the image sensor 130 may be constantly exposed to light. In these embodiments, the photodiode 154 may need to be reset or depleted before a desired image is to be captured. In other embodiments, an anti-blooming gate 194 may be used for a similar purpose. Once the charge from the photodiode 154 has been depleted, the storage gate 190, the transfer gate 158, and the reset gate 156 may be turned off, isolating the photodiode 154. The photodiode 154 may then begin collecting light transmitted to the image sensor 130 from the lens 126 and integrating charge derived therefrom. As the photodiode 154 receives light, it starts to collect charge generated by the incident photons. The charge remains in the photodiode 154 because the storage gate 190 connecting the photodiode 154 to the storage node 192 is turned off, as is the anti-blooming gate 194.

Once integration is complete and the photodiode 154 has collected light 128 from the lens 126, the reset gate 156 may be turned on to reset the floating diffusion node 163 and/or the transfer gate 158 may be turned on to reset the storage node 192. The storage gate 190 may then be activated and the charge from the photodiode 154 may be transmitted to the storage node 192. The charge from the photodiode 154 may be held at the storage node 192 until the pixel 136 is ready to be read out. In the global shutter operation, each row within the pixel architecture 134 may be reset and exposed (i.e., integrate charge generated by light transmitted through the lens 126) at substantially the same time. Each pixel 136 may simultaneously transfer the charge from the photodiode 154 to a storage node, and then each pixel 136 may be read out row by row in some embodiments. When the pixel 136 is to be read out row by row, the transfer gate 158 may be activated to transfer the charge from the storage node 192 to the floating diffusion node 163. Once the charge is stored in the floating diffusion node 163, the row select gate 162 may be activated, and the SF gate 160 amplifies the charge in the floating diffusion node 163 and provides a signal indicative thereof through the row select gate 162.

Pixel Structure

Figure 6A:
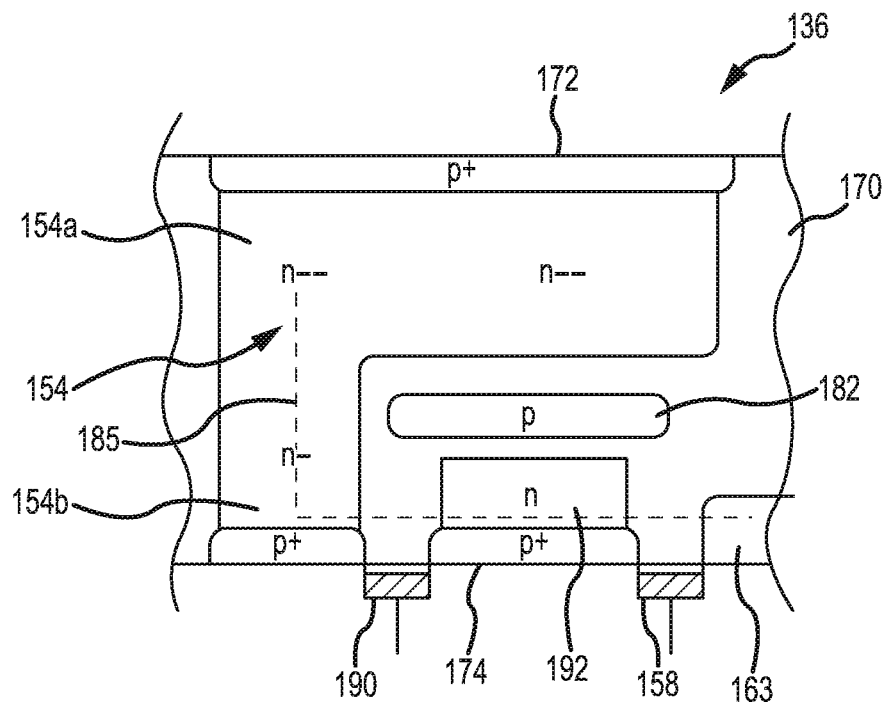
FIG. 6A is a simplified schematic cross-section view of one embodiment of an image sensor pixel.

With reference now to FIG. 6A, a simplified schematic cross section for one embodiment of a pixel 136 is shown. The pixel 136 includes a photodiode 154 with at least two regions 154a, 154b. The two regions 154a, 154b are coupled together but have different electric potentials. The first region 154a has a first electric potential, and the second region 154b has a second electric potential, with the second electrical potential being greater than the first. As described herein, the electric potential of a region may refer to the potential of the region before and/or after the region is depleted during operation, as described above.

As described in more detail below with reference to FIGS. 12A and 12B, the electric potential of the regions 154a, 154b may be different because the regions 154a, 154b were doped differently during manufacture of the pixel 136, thereby causing more or fewer ionized atoms to be present in the regions 154a, 154b compared to one other. For example, the first region 154a may have been very lightly doped (shown as "n- -" in FIG. 6A), whereas the second region 154b may have been lightly doped (shown as "n-" in FIG. 6A). Alternatively, or additionally, the first region 154a may have been doped with one type of implant, and the second region 154b may have been doped with a different type of implant, for example an implant with a different energy. Alternatively, or additionally, the first and second regions 154a, 154b may have had different thermal treatments applied.

The second region 154b of the photodiode 154 may be offset in depth from the first region 154a of the photodiode 154a within a single semiconductor chip 170, one example of which is illustrated in FIG. 6A. The first region 154a may have a larger cross-section than the second region 154b, and the electric potential of the second region 154b may be higher than the electric potential of the first region 154a. In this manner, as described below, charge that is generated in the first region 154a may be funneled to the second region 154b because of the potential difference between the two regions 154a, 154b.

The thickness (in depth) of the two regions 154a, 154b of the photodiode 154 may vary among different embodiments. In one embodiment, the first region 154a may be substantially thicker than the second region 154b. In other embodiments, the second region 154b may be thicker than the first region 154a. In one particular embodiment, the thickness of the first region 154a may be determined by the expected depth at which most or all incident light will be converted into electrical charge within the photodiode 154. In other words, in one embodiment, the first region 154a may be engineered so that few, if any, photons are not converted into electron-hole pairs within the first region 154a, and, consequently, so that few, if any, photons proceed to the storage node 192. Alternatively, or in addition to having a thick first region 154a, a shielding layer 182, 183 may be used in some embodiments, as described below.

In some embodiments, the photodiode 154 may include only two regions 154a, 154b, whereas in other embodiments, the photodiode 154 may include more than two regions. For example, the photodiode may include a transition region (not shown in FIG. 6A) between the first and second regions, with the electric potential of the transition region gradually increasing. The transition region may be formed naturally as a result of the doping and implantation manufacturing processes, or may be deliberately formed. In other embodiments, however, the doping concentration, and thus the potential, of the two regions 154a, 154b may be stepped, or may transition abruptly from one concentration/potential to the other concentration/potential.

As illustrated in FIG. 6A, in some embodiments, the photodiode 154 may substantially extend between a first surface 172 and a second surface 174 of a semiconductor chip 170, with the first region 154a of the photodiode 154 positioned proximate the first surface 172 and the second region 154b of the photodiode 154 positioned proximate the second surface 174 of the semiconductor chip 170. The first surface 172 of the semiconductor chip 170 may be the "backside" 172 of the chip 170, and the second surface 174 of the semiconductor chip 170 may be the "frontside" 174 of the chip 170. As described below, this may allow the entire first side 172 of the semiconductor chip 170 for pixel 136 to be used for illumination of the photodiode 154 (specifically, the first region 154a of the photodiode 154), while the second surface 174 of the semiconductor chip 170 can be used for transferring charge to the storage node 192 and to the floating diffusion node 163. In this manner, no storage node or charge transfer circuitry may be present on the first surface 172 of the semiconductor chip 170 such that nearly all of the first surface 172 of the semiconductor chip 170 can be used for photodiodes 154 for various pixels 136, thus increasing the sensitivity of the pixels 136 as compared to prior art pixels with charge storage nodes and charge transfer circuitry on the same surface as the photodiode. In other examples, however, the photodiodes 154 may not fill the entire first surface 172 of the semiconductor chip 170 so that other circuitry or nodes can be present on the first surface 172 of the semiconductor chip 170.

In some but not all embodiments, the photodiode 154 may be pinned to the first and/or second surfaces 172, 174 of the semiconductor chip 170 (illustrated by the shallow p+ regions on the surfaces of the photodiode 154 in FIG. 6A). Pinning one or both surfaces 172, 174 of the photodiode 154 may reduce dark current, and thus improve signal to noise ratios in some embodiments.

Referring still to FIG. 6A, the pixel 136 also includes a storage node 192, at least a portion of which may be positioned at substantially the same depth in the semiconductor chip 170 as at least a portion of the second region 154b of the photodiode 154, and may be positioned proximate the second surface 174 of semiconductor chip 170. The storage node 192 may be positioned at least partially beneath the first region 154a of the photodiode 154. In some embodiments, the storage node 192 is positioned entirely beneath the first region 154a of the photodiode 154 so that the first region 154a effectively shields the storage node 192 from light incident on the back surface 172 of the semiconductor chip 170. This positioning may allow for high shutter efficiency for the pixel 136.

The storage node 192 may have an electric potential that is higher than the second region 154b of the photodiode 154, so that charge that accumulates in the second region of the photodiode 154b can be transferred to the storage node 192 when the storage gate 190 is activated. The storage node 192 may have a higher potential than the second region 154b of the photodiode 154 because, for example, the storage node 192 was doped with a higher concentration of dopant (shown as "n" in FIG. 6A) during manufacturing as compared with the second region 154b.

The storage node 192 may in some embodiments be less thick (in depth) than, as deep as (in depth), or more thick (in depth) than the second region 154b of the photodiode 154 in different embodiments. In embodiments where the thickness in depth of the second region 154b of the photodiode 154 is less than the thickness in depth of the storage node 192, charge may be transferred from the second region 154b of the photodiode 154 to the storage node 192 during operation, as described in more detail below. In some embodiments, the storage node 192 may be pinned to one surface 174 of the semiconductor chip 170, for example, the same surface 174 of the semiconductor chip 170 to which the second region 154b of the photodiode 154 is pinned.

One or more storage gates 190 may be operable to transfer charge from the photodiode 154 to the storage node 192. With reference to FIG. 6A, the storage gate 190 may be formed on the second surface 174 of the semiconductor chip 170 and may be coupled between the second region 154b of the photodiode 154 and the storage node 192. The storage gate 190 may thus be configured to form a channel between the photodiode 154 and the storage node 192 responsive to an applied voltage, with charge being transferable over the formed channel. Also, the pixel 136 may include a floating diffusion node 163, and a transfer gate 158 coupling the storage node 192 to the floating diffusion node 163, the operation of which is described above.

In some embodiments, the pixel 136 may include one or more shielded regions 182. With reference to FIG. 6A, one shielded region 182 may be an electrical shield, and may be configured to shield the storage node 192 from charge that is generated in the first region 154a of the photodiode 154. The shielded region 182 may, for example, be a layer that is p-doped.

In some examples, the shielded region 182 may laterally extend the entire width and length of the storage node 192 in order to shield the storage node 192 from light incident from the first region 154*a* of the photodiode 154 (i.e., that was not converted to electron-hole pairs in the photodiode). In another example, the shielded region may also or alternatively extend in depth between the second region 154*b* of the photodiode 154 and the storage node 192. Also, in those examples where a floating diffusion node 163 is proximate the second surface 174 of the semiconductor chip 170, the shielded region 182 may extend partially or fully over the floating diffusion node 163.

Figure 6B:
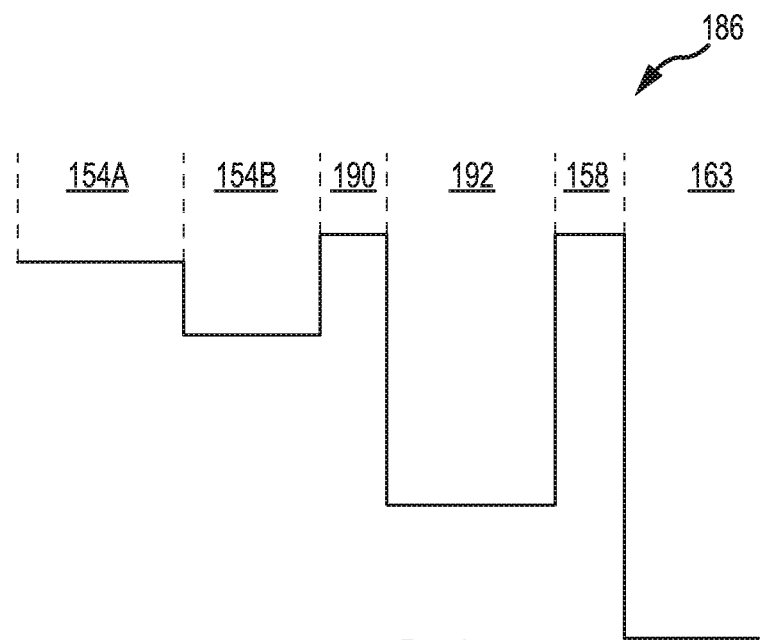
FIG. 6B is a simplified potential profile of the image sensor pixel shown in FIG. 6A.

With reference now to the potential profile 186 illustrated in FIG. 6B, representative of the electric potential of the pixel 136 in FIG. 6A along dotted line 185 in FIG. 6A, the relative electric potentials of the first and second photodiode regions 154*a*, 154*b*, the storage node 192, and the floating diffusion node 163 are shown. As illustrated, the electric potential for the second region 154*b* of the photodiode 154 is greater than the electric potential of the first region 154*a*. Also, the electric potential of the storage node 192 is greater than the electric potential of the second region 154*b* of the photodiode 154, and the electric potential of the floating diffusion node 163 is greater than the electric potential of the storage node 192. In this manner, and as described now with reference to FIGS. 7A through 11B, charge generated in the first region 154*a* of the photodiode 154 from incident photons may be transferred to the floating diffusion node 163 upon the proper signaling of the storage and transfer gates 190, 158.

Pixel Operation

Figure 7A:
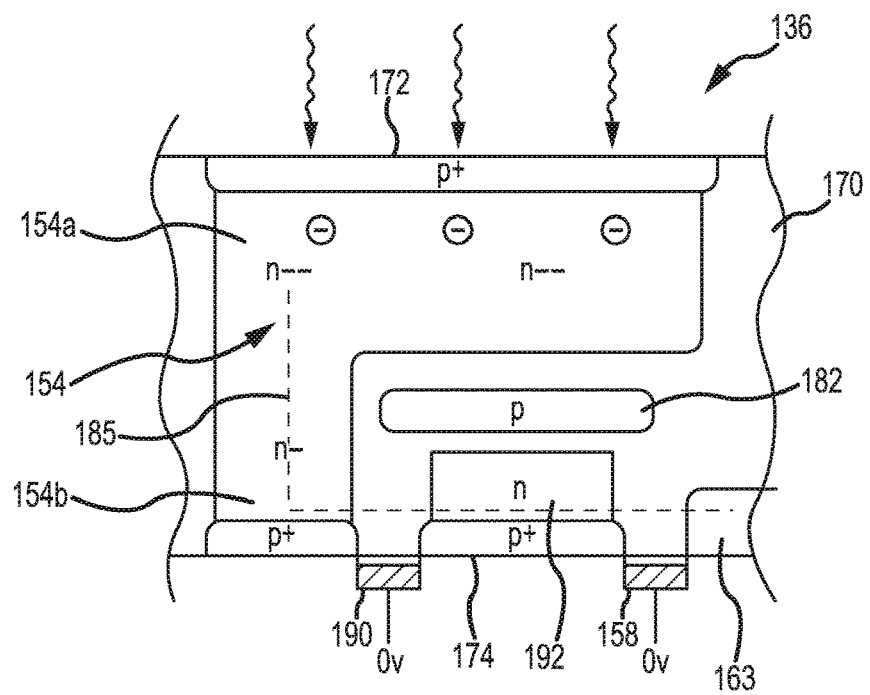
FIGS. 7A through 11B illustrate the operation of the image sensor pixel shown in FIG. 6A.
Figure 7B:
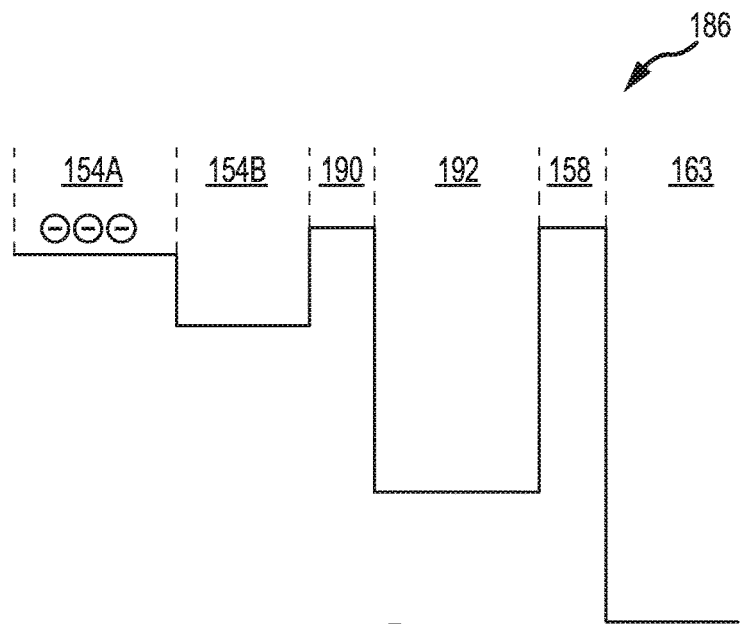
Figure 8A:
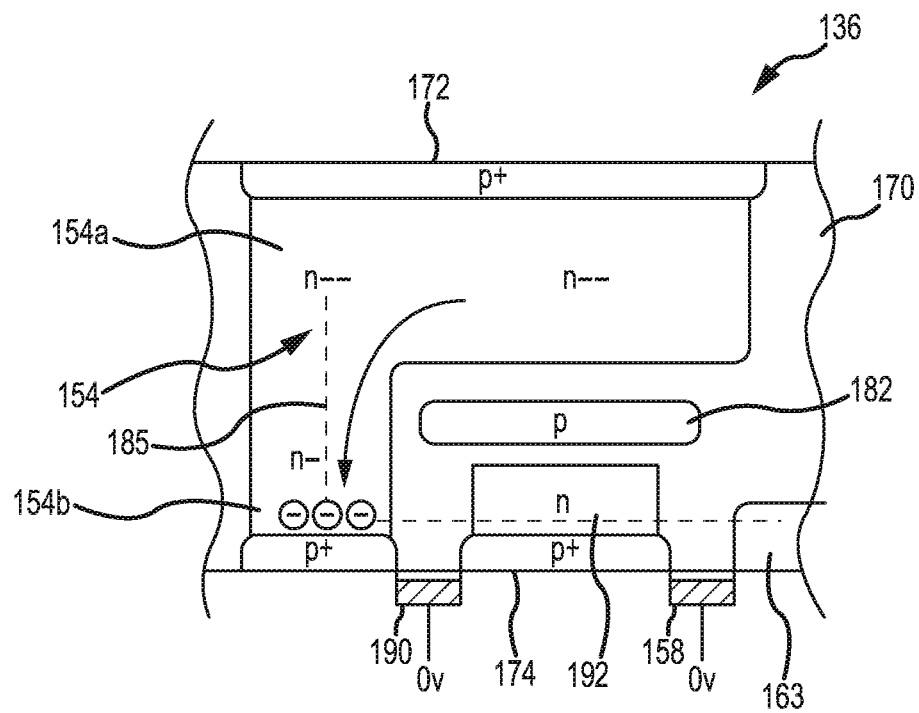
Figure 8B:
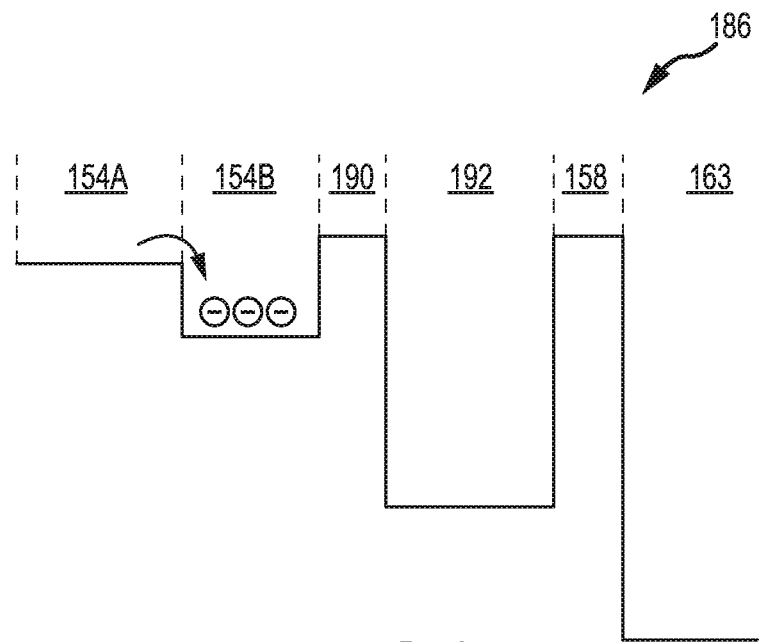

In FIG. 7A and the corresponding potential profile 186 of the pixel 136 in FIG. 7B, the pixel 136 is in integration mode and electron-hole pairs are generated in the first region 154*a* of the photodiode 154 as a result of incident light. As also illustrated in the corresponding potential profile 186 in FIG. 7B, the charge carriers (electrons here) initially are located in the first region 154*a* of the photodiode 154. Of course, in some examples, some charge may be generated in the second region 154*b* of the photodiode as well (e.g., for photons that are not absorbed in the first region 154*a*. In any event, because of the potential difference between the first and second regions 154*a*, 154*b* of the photodiode 154, the charge from the first region 154*a* is funneled or swept to the second region 154*b* soon after it is generated, as illustrated by FIGS. 8A and 8B. Because the potential of the second region 154*b* is greater than the potential of the first region 154*a*, most of the charge generated in the photodiode 154 will be stored in the second region 154*b* of the photodiode 154.

Figure 9A:
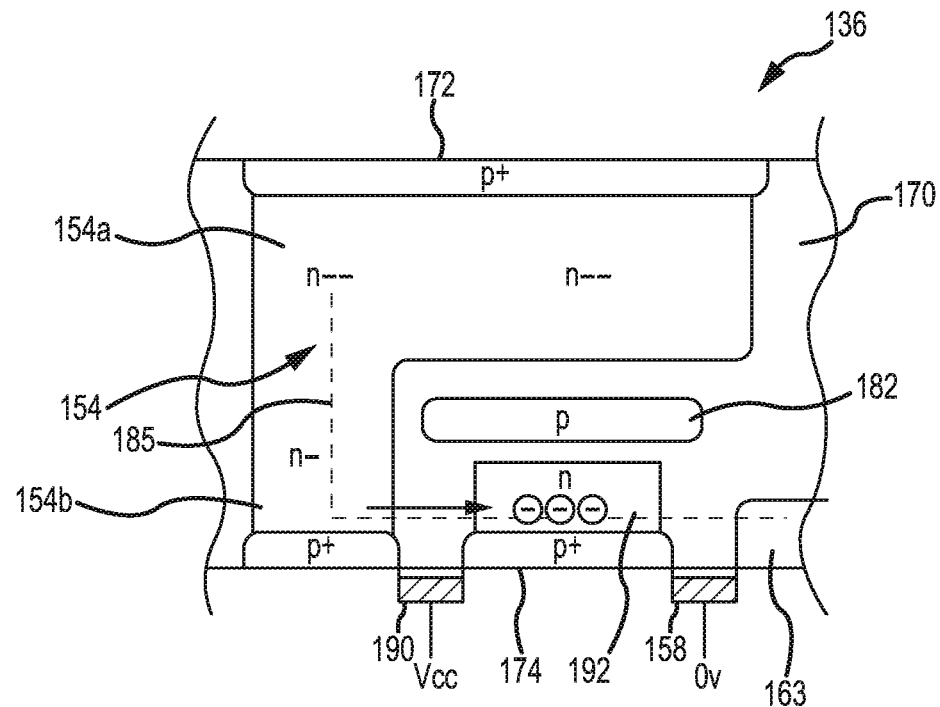
Figure 9B:
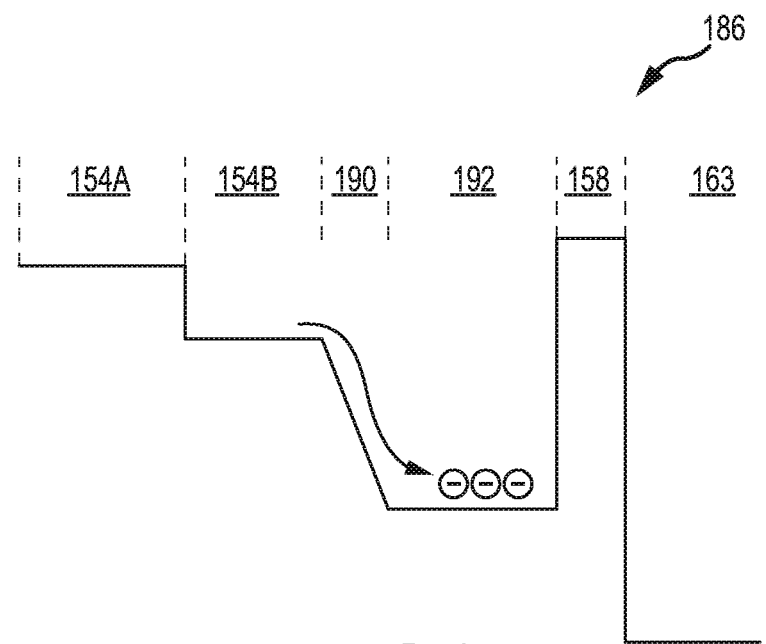

After integration is complete, or even during integration in some embodiments, the storage gate 190 may be activated (e.g., by providing a high voltage to its gate terminal), which may cause a channel to form proximate the second surface 174 between the second region 154*b* of the photodiode 154 and the storage node 192. As illustrated in FIGS. 9A and 9B, activating the storage gate 190 may cause the charge stored in the second region 154*b* of the photodiode to be transferred through the channel formed by the storage gate 190 to the storage node 192. As discussed above, in global shutter pixels 136, the integration and transfer of generated charge from the photodiode 154 to the storage node 192 may occur at substantially the same time for all pixels 136 in an image sensor.

Figure 10A:
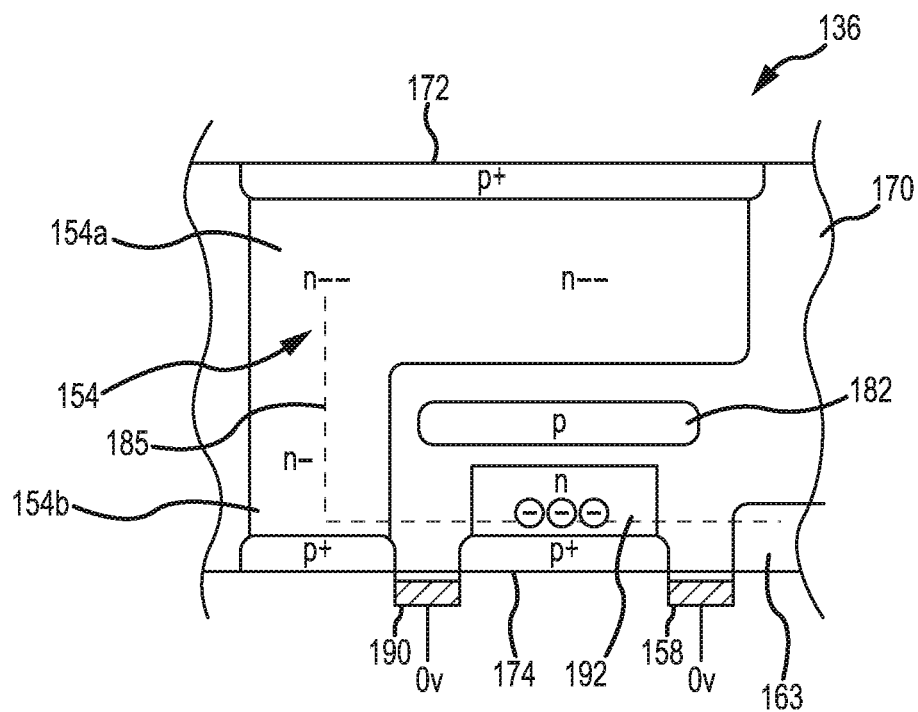
Figure 10B:
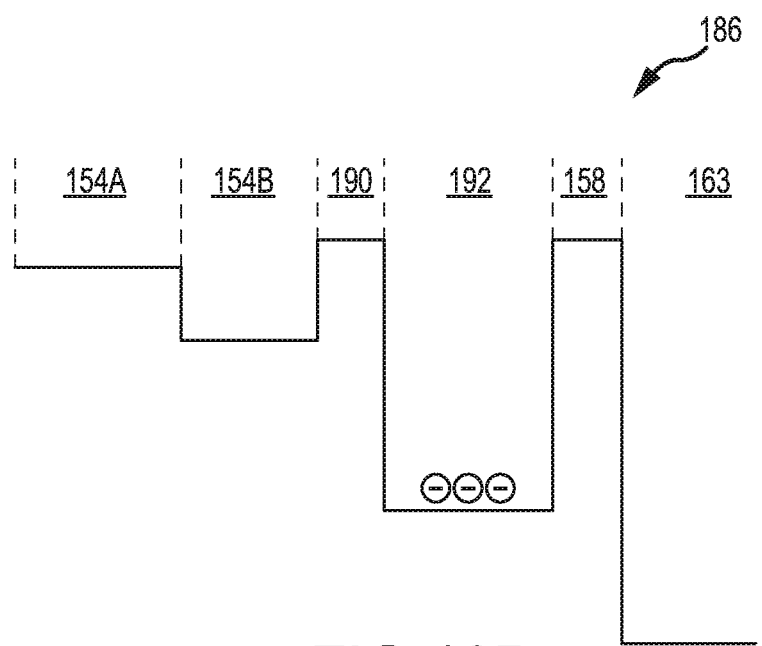
Figure 11A:
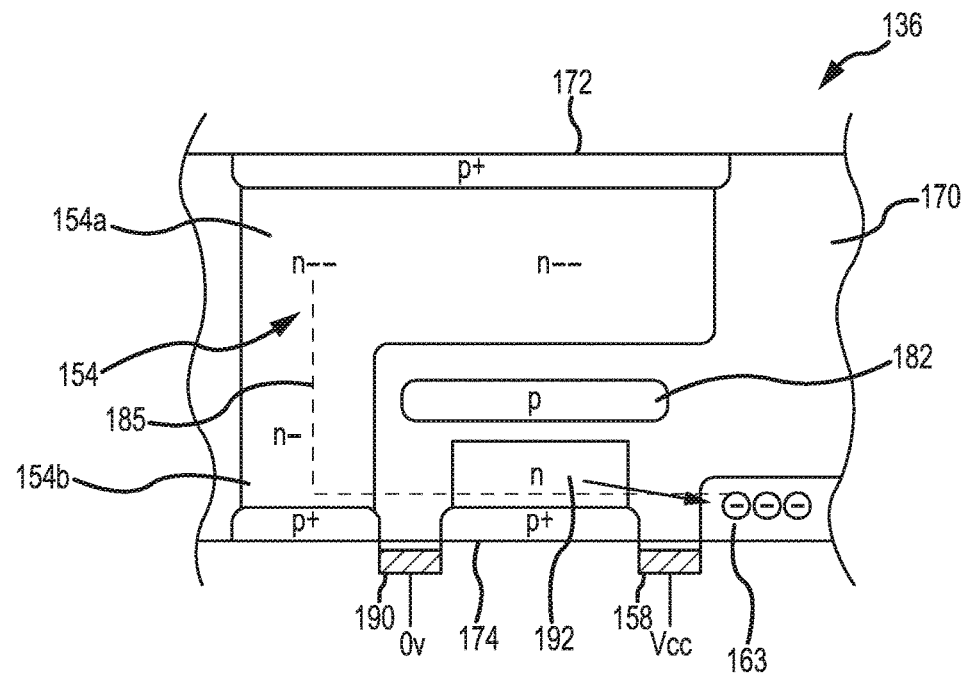
Figure 11B:
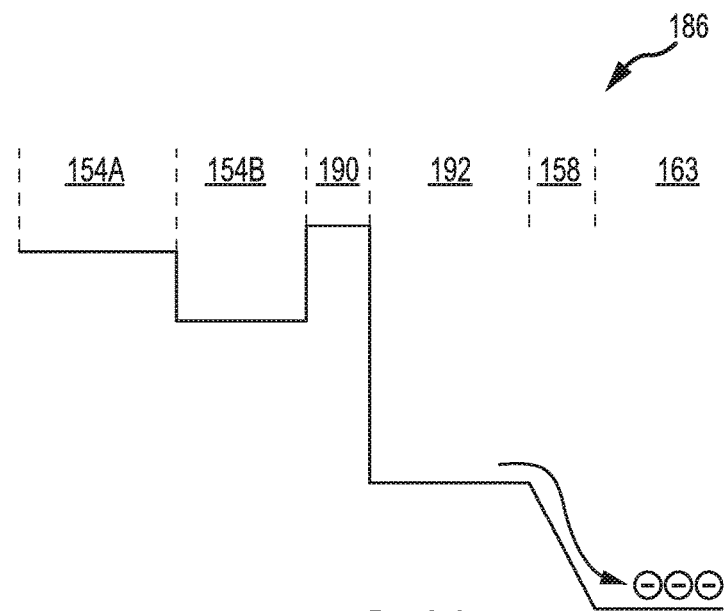

After the charge has been transferred to the storage node 192, the storage gate 190 is deactivated, and the charge is isolated in the storage node 192 as illustrated in FIGS. 10A and 10B. Because the storage node 192 is positioned at least partially beneath the first region 154*a* of the photodiode 154, the storage node 192 may be electrically and/or optically shielded from charge or photons from the photodiode 154, so that the charge stored in the storage node 192 across an image sensor can be read out one row and column at a time, without incurring the blurring and noise typically associated with a rolling shutter pixel architecture. As illustrated in FIGS. 11A and 11B, the charge stored in the storage node 192 may be transferred to a floating diffusion node 163 by activating a transfer gate 158. In some examples, correlated double sampling (CDS) may be used because the storage node 192 and/or the floating diffusion node 163 may be sampled both before and after charge is stored therein.

Pixel Manufacturing

Figure 12A:
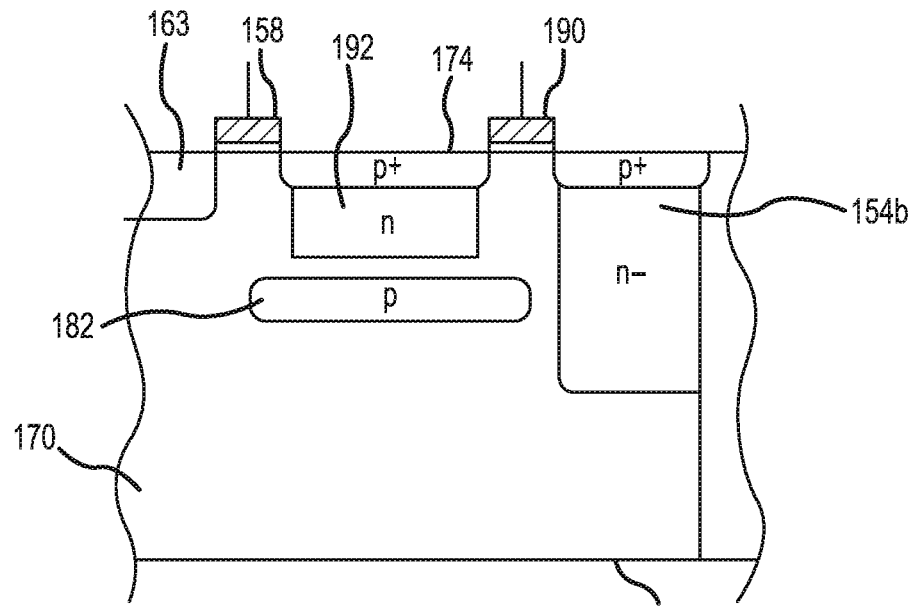
FIGS. 12A and 12B illustrate one embodiment of steps for manufacturing the image sensor pixel shown in FIG. 6A.
Figure 12B:
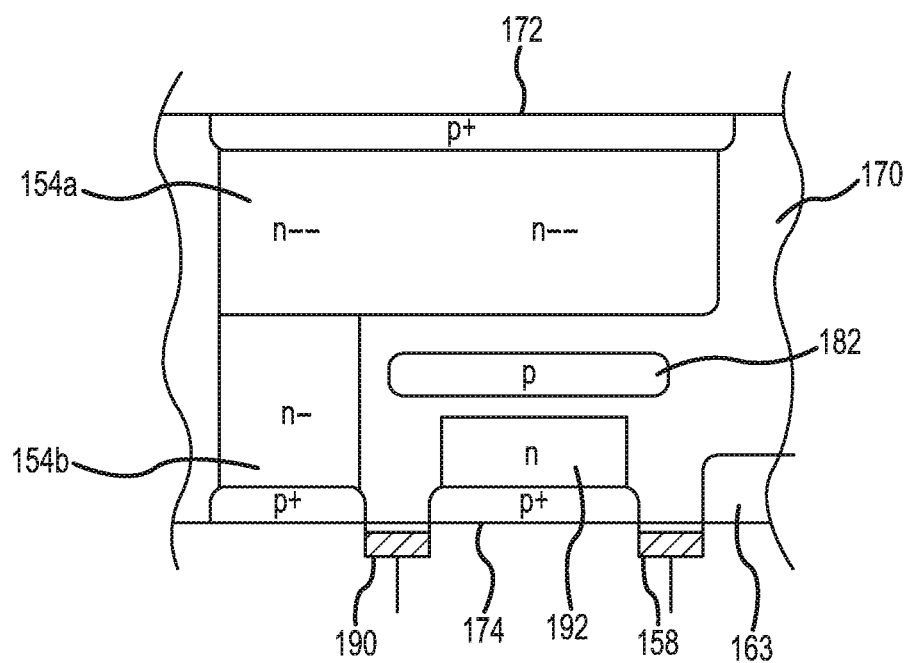

With reference now to FIGS. 12A and 12B, one embodiment of manufacturing the pixel 136 illustrated in FIG. 6A will now be described. In FIG. 12A, the second surface 174 (e.g., the front side) of the semiconductor chip 170 is processed by forming the second region 154*b* of the photodiode 154, the storage node 192, and, in some embodiments, forming the shielding region 182, the floating diffusion node 163, the storage gate 190, and the transfer gate 158. These components of the pixel 136 may be formed using conventional semiconductor device lithographic and implantation processes. In some examples, the second region 154*b* and the storage node 192 may be formed using the same type of dopant, such as an n-type dopant. The concentration of the dopant used to form the second region 154*b*, however, may be less than the concentration of the dopant used to form the storage node 192 so that, as described above, when the storage gate 190 is activated, charge will flow from the second region 154*b* to the storage node 192. In other examples, the second region 154*b* and the storage node 192 may be formed using different types of dopants, with similar or different concentrations, such that the potential of the storage node 192 is greater than the second region 154*b* during operation of the pixel 136. In still other examples, voltages or other techniques may be used to increase the potential of the second region 154*b* relative to the potential of the storage node 192.

After the second surface 174 has been processed, the first surface 172 of the semiconductor chip 170 may be processed by forming the first region 154*a* of the photodiode 154. The first region 154*a* of the photodiode 154 may be formed such that it at least partially overlaps with the second region 154*b* in depth so that charge generated in the first region 154*a* may be funneled to the second region 154*b*. Also, in some embodiments, the second surface may be processing using blanket implants, since the second regions 154*b* of the pixels 136 may substantially define the pixels 136. Using blanket implants may allow one or more lithographic or other semiconductor device processing steps to be skipped when processing the first surface 172, thereby reducing manufacturing and processing costs.

Although the pixel 136 has been described in FIGS. 12A and 12B as being manufactured by processing the second surface 174 before processing the first surface 172, in another embodiment, the first surface 172 is processed before the second surface 174. In still other embodiments, the first or second surfaces 172, 174 may be only partially processed before proceeding to the other, or may be processed at substantially the same time. Also, as illustrated in FIGS. 12A and 12B, one or more portions of the first and second surfaces 172, 174 may be pinned by forming a shallow p+ region in, for example, both surfaces of the photodiode 154 and the sole exposed surface of the storage node 192.

Additional Pixel Structures

Figure 13:
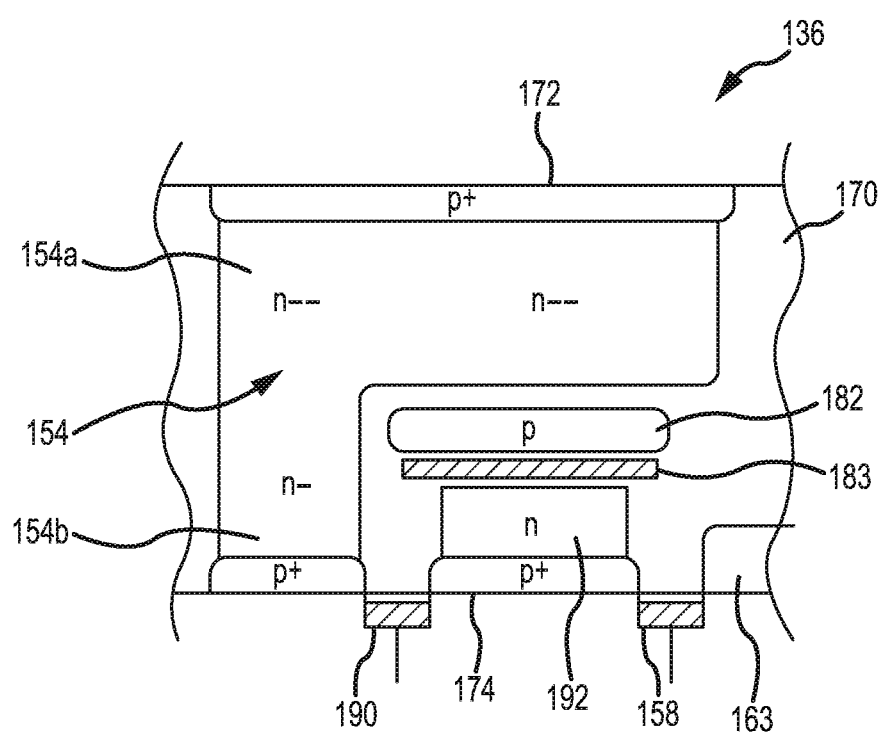
FIG. 13 is a simplified schematic cross-section view of another embodiment of an image sensor pixel.

With reference to FIG. 13, a pixel 136 is shown that is substantially similar to the pixel 136 shown in FIG. 6A, except that an additional shielding layer 183 may be used. The shielding layer 183 may be an optical shield, and may be used in addition to or in place of the electrical shield 182 described with reference to FIG. 6A. The optical shielding layer 183 may include a light reflective material (e.g., a shiny metal) that reflects any light that is not converted into charge in the first region 154a of the photodiode 154 so that the light does not corrupt the charge stored in the storage node 192. The optical shielding layer 183 may be formed during manufacturing by, for example, depositing the material and epitaxially growing semiconductor material around the optical shielding layer 183, form which the other components of the pixel 136 may subsequently be formed. In those embodiments where an optical shielding layer 183 is used, the first region 154a of the photodiode 154 may be thinner than in those embodiments without an optical shielding layer 183 because there may be less of a chance of light corrupting the charge stored in the storage node 192.

Figure 14:
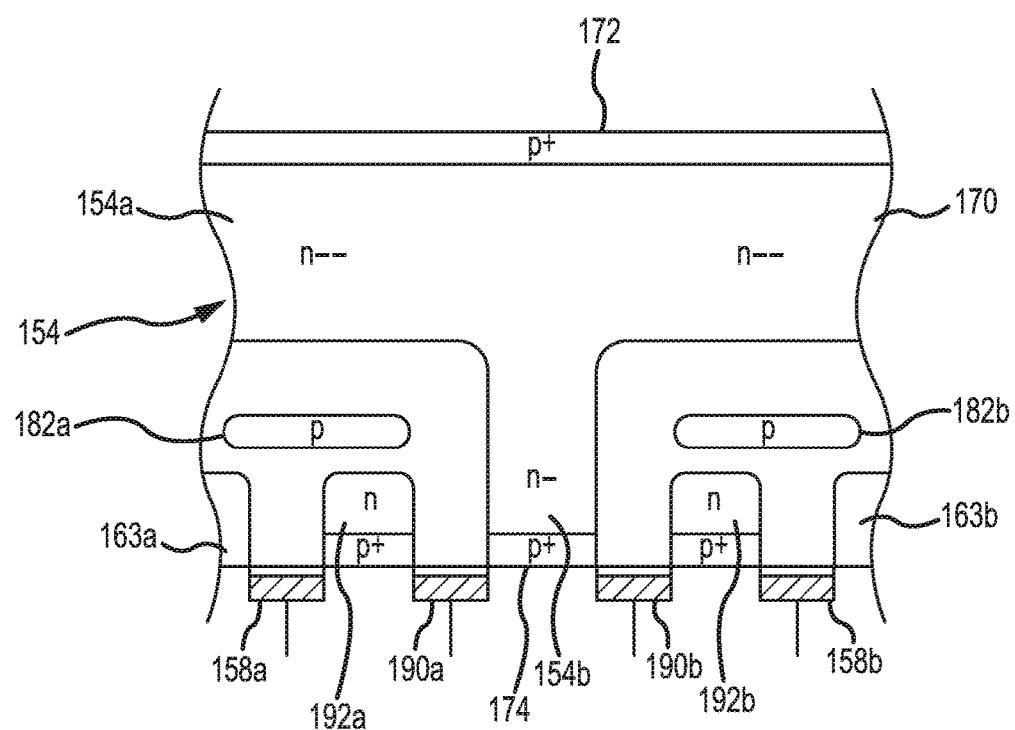
FIG. 14 is a simplified schematic cross-section view of another embodiment of an image sensor pixel.

In FIG. 14, another embodiment of a pixel 136 is shown, in which the pixel 136 includes a plurality of storage nodes 192a, 192b. In general, the pixel 136 may include any number of storage nodes (e.g., 1, 2, 3, 4, 5, 6, etc.). In some embodiments, a plurality of storage nodes such as the storage nodes 192a, 192b illustrated in FIG. 14 may be used simultaneously to store charge (e.g., they together may be equivalent to the single storage node 192 illustrated in FIG. 6A), whereas in other embodiments, the plurality of storage nodes may be used sequentially to store charge corresponding to different frames of data. For example, one storage node 192a may be used to store charge from a first frame of the image sensor, and the other storage node 192b may be used to store charge from a second frame of the image sensor. Such sequential use of a plurality of storage nodes 192a, 192b may allow for various image sensor techniques to be used, including for example high-dynamic range (HDR) imaging, pixel sharing, buffering, burst-mode readout, and so forth. As illustrated in FIG. 14, for each storage node 192a, 192b, the pixel 136 may include a corresponding storage gate 190a, 190b, transfer gates 158a, 158b, floating diffusion nodes 163a, 163b, shielding layers 182a, 182b, and so forth. However, in other embodiments (not shown in FIG. 14), multiple storage nodes 192a, 192b may be coupled to and transfer charge to a common floating diffusion node.

Figure 15:
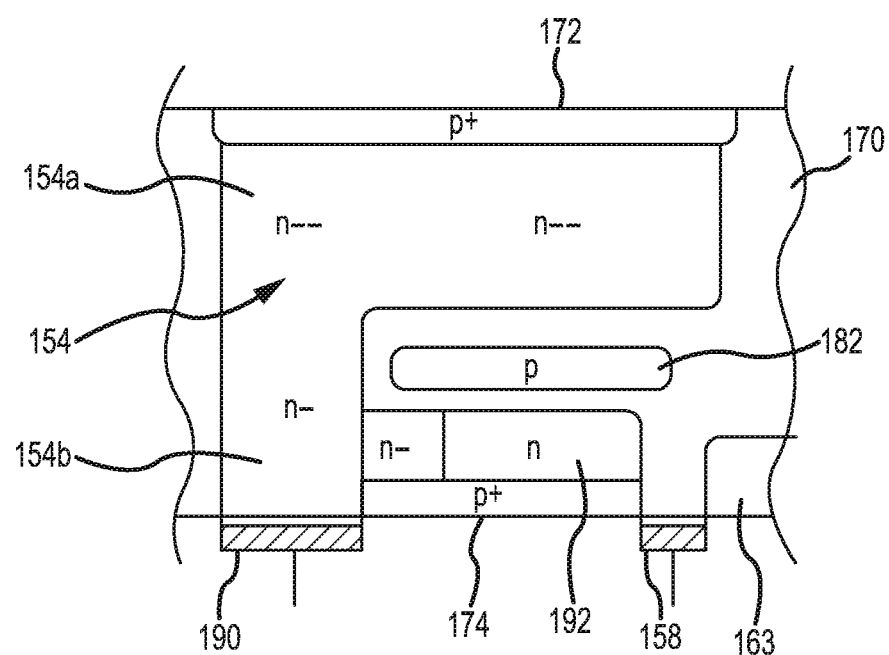
FIG. 15 is a simplified schematic cross-section view of yet another embodiment of an image sensor pixel.

In FIG. 15, yet another embodiment of an image sensor pixel 136 is shown. In FIG. 15, the storage gate 190 is coupled to the second region 154b of the photodiode 154 (as opposed to the surface 174 of the semiconductor chip 170 between the second region 154b and the storage node 192, as in FIG. 6A) and may be configured to selectively increase the potential of the second region 154b responsive to an applied voltage. In this configuration, the inherent potential of the second region 154b of the photodiode 154 may or may not be greater than the potential of the first region 154a, but, in any event, the storage gate 190 may pump any charge generated in the first region 154a towards the second surface 174 of the semiconductor chip 170 so that it can be swept into the storage node 192. As illustrated in FIG. 15, the storage node 192 may be bifurcated into two differently doped regions, and may also be pinned, such that a virtual barrier is created for charge until the voltage applied to the storage gate 190 decreases in order to allow the charge to flow into the storage node 192. In this embodiment, the second region 154b of the photodiode 154 may not be pinned to the second surface 174. In still another embodiment (not shown in the figures), and as briefly mentioned above, a charge pumping gate, similar to the gate 190 in FIG. 15, may be used to alter the potential of one or both of the first and/or second regions 154a, 154b of the photodiode 154 illustrated in FIG. 6A so that charge is funneled from the first region 154a to the second region 154b during integration.

Conclusion

The foregoing description has broad application. For example, while examples disclosed herein may focus on particular architectures of image sensors (e.g., photodiode, global shutter, CMOS sensors, etc.), it should be appreciated that the concepts disclosed herein may equally apply to substantially any other type of image sensor with or without appropriate modifications as would be appreciated by one skilled in the art of image sensors. Moreover, although certain examples have been described with reference to particular dopants (e.g., a storage node 192 in FIG. 6A that is doped with n-type material), it will be understood that other dopants are also within the scope of this disclosure and the appended claims. For example, referring back to FIG. 6A, the storage node 192 may be doped with p-type dopant in an n-type substrate.

Furthermore, the various embodiments described herein may find application in many different implementations. For example, although the funneling of charge has been described with reference to two regions 154a, 154b of a photodiode 154, in other embodiments, charge may be transferred between two regions of a storage node, or between a storage node and another type of node using different regions with different potentials.

Accordingly, the discussion of any embodiment is meant only to be exemplary and is not intended to suggest that the scope of the disclosure, including the claims, is limited to these examples.

What is claimed is:

1. An image sensor pixel comprising:
   a photosensitive region formed along a surface of a semiconductor chip;
   a storage node below and at least partially overlapping with the photosensitive region; and
   a second region configured to transfer charge from the photosensitive region to the storage node;
   wherein:
   the photosensitive region is doped with a first concentration of a dopant; and
   the second region is doped with a second concentration of the dopant that is greater than the first concentration.

2. The image sensor pixel of claim 1, wherein the storage node is positioned entirely beneath the photosensitive region.

3. The image sensor pixel of claim 1, further comprising a floating diffusion node configured to receive a charge from the storage node.

4. The image sensor pixel of claim 3, wherein:
   the floating diffusion node is coupled to the storage node by a transfer gate that is configured to reset the storage node when activated; and
   the storage node is coupled to the photosensitive region by a storage gate operable to selectively transfer charge from the photosensitive region to the storage node.

5. The image sensor pixel of claim 3, wherein:
   the surface is a first surface of the semiconductor chip;
   the storage node is formed along a second surface of the semiconductor chip opposite to the first surface; and
   the floating diffusion node is positioned proximate to the second surface of the semiconductor chip.

6. The image sensor pixel of claim 3, wherein the floating diffusion node is positioned on a separate chip that is distinct from the semiconductor chip.

7. The image sensor pixel of claim 1, further comprising a shielding region configured between the photosensitive region and the storage node.

8. An image sensor comprising:
a photodiode having a photosensitive first region formed along a first surface of a semiconductor chip and a second region formed below a portion of the first region and extending to proximate a second surface opposite to the first surface of the semiconductor chip;
a storage node formed in the semiconductor chip at a depth below and at least partially overlapping with the first region; and
a storage gate coupled to a second surface of the semiconductor chip opposite to the first surface and configured to pump a charge from the second region to the storage node;
wherein:
the first region is doped with a first concentration of a dopant; and
the second region is doped with a second concentration of the dopant, the second concentration being greater than the first concentration.

9. The image sensor of claim 8, wherein the storage gate is configured to selectively increase a potential of the second region in response to an applied voltage.

10. The image sensor of claim 8, wherein a first inherent potential of the first region is approximately equal to a second inherent potential of the second region.

11. The image sensor of claim 8, wherein the storage node is bifurcated into two regions having different levels of doping.

12. The image sensor of claim 8, wherein the surface is a first surface of the semiconductor chip; and
the storage node is pinned to the second surface.

13. The image sensor of claim 12, wherein:
pinning the storage gate creates a virtual barrier for charge entering from the storage gate until an applied voltage to the storage gate is reduced.

14. The image sensor of claim 8, wherein the second region is not pinned to the second surface of the semiconductor chip.

15. The image sensor of claim 8, wherein:
the storage node is a first storage node;
the depth of the first storage node is a first depth;
the storage gate is first storage gate; and
the image sensor further comprises:
a second storage node formed in the semiconductor chip at a second depth below and at least partially overlapping with the first region; and
a second storage gate positioned on the second surface of the semiconductor chip and configured to pump a charge from the second region to the second storage node.

16. The image sensor of claim 15, wherein the second storage node is located opposite to the first storage node with respect to the second region.

17. An image pixel comprising:
a photodiode having a photosensitive first region positioned along a first surface of a semiconductor chip and a second region positioned below a portion of the first region; and
a storage node positioned proximate to a second surface of the semiconductor chip opposite to the first surface and at least partially overlapping the first region of the photodiode,
wherein the storage node is bifurcated into a first region having a first doping level and a second region having a second doping level that is different than the first doping level.

18. The image pixel of claim 17, wherein the storage node is coupled to the photodiode by a storage gate that is configured to pump a charge from the photodiode to the storage node in response to an applied voltage.

19. The image pixel of claim 17, wherein the bifurcated storage node is pinned to the second surface and forms a virtual barrier that resists charge from entering the storage node until the applied voltage is reduced.

20. The image pixel of claim 17, further comprising:
a floating diffusion node that is configured to receive a charge from the storage node; and
a transfer gate coupling the storage node to the floating diffusion node and configured to reset the storage mode when activated.

* * * * *

UNITED STATES PATENT AND TRADEMARK OFFICE
CERTIFICATE OF CORRECTION

PATENT NO. : 10,263,032 B2
APPLICATION NO. : 15/056752
DATED : April 16, 2019
INVENTOR(S) : Chung Chun Wan Page 1 of 1

It is certified that error appears in the above-identified patent and that said Letters Patent is hereby corrected as shown below:

In the Claims

Claim 14, Column 13, Lines 42-44, should read:
14. The image sensor of claim 8, wherein the second region is pinned to the second surface of the semiconductor chip.

Signed and Sealed this
Twenty-ninth Day of October, 2019

Andrei Iancu
*Director of the United States Patent and Trademark Office*